(12) United States Patent
Choi

(10) Patent No.: US 11,557,543 B2
(45) Date of Patent: Jan. 17, 2023

(54) SEMICONDUCTOR PACKAGE

(71) Applicant: SAMSUNG ELECTRONICS CO., LTD., Suwon-si (KR)

(72) Inventor: Eunkyoung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 19 days.

(21) Appl. No.: 17/208,798

(22) Filed: Mar. 22, 2021

(65) Prior Publication Data

US 2022/0028791 A1 Jan. 27, 2022

(30) Foreign Application Priority Data

Jul. 27, 2020 (KR) ........................ 10-2020-0093029

(51) Int. Cl.
*H01L 23/538* (2006.01)
*H01L 25/18* (2006.01)
(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/562* (2013.01);
(Continued)

(58) Field of Classification Search
CPC ............ H01L 23/5389; H01L 21/4853; H01L 21/4857; H01L 21/565; H01L 21/568; H01L 21/6835; H01L 23/3128; H01L 23/5383; H01L 23/5386; H01L 23/562; H01L 24/19; H01L 24/20; H01L 25/105; H01L 25/18; H01L 2221/68372; H01L 2224/214; H01L 2225/1035; H01L 2924/19105; H01L 2924/3511
See application file for complete search history.

(56) References Cited

U.S. PATENT DOCUMENTS 7,989,270 B2 8/2011 Huang et al.
9,299,649 B2 3/2016 Chiu et al.
(Continued)

*Primary Examiner* — Fernando L Toledo
*Assistant Examiner* — Neil R Prasad
(74) *Attorney, Agent, or Firm* — F. Chau & Associates, LLC

(57) ABSTRACT

A semiconductor package includes a first semiconductor chip including a first surface and a second surface, and including a first active layer on a portion adjacent to the first surface; a first redistribution structure on the first surface of the first semiconductor chip, wherein the first redistribution structure includes a first area and a second area next to the first area; a second semiconductor chip mounted in the first area of the first redistribution structure, including a third surface, which faces the first surface, and a fourth surface, and including a second active layer on a portion adjacent to the third surface; a conductive post mounted in the second area of the first redistribution structure; a molding layer at least partially surrounding the second semiconductor chip and the conductive post on the first redistribution structure; and a second redistribution structure disposed on the molding layer and connected to the conductive post.

20 Claims, 16 Drawing Sheets

(51) Int. Cl.
  *H01L 23/31* (2006.01)
  *H01L 23/00* (2006.01)
  *H01L 21/683* (2006.01)
  *H01L 21/48* (2006.01)
  *H01L 21/56* (2006.01)
  *H01L 25/10* (2006.01)

(52) U.S. Cl.
  CPC ............. *H01L 24/19* (2013.01); *H01L 24/20* (2013.01); *H01L 25/105* (2013.01); *H01L 25/18* (2013.01); H01L 2221/68372 (2013.01); H01L 2224/214 (2013.01); H01L 2225/1035 (2013.01); H01L 2924/19105 (2013.01); H01L 2924/3511 (2013.01)

(56) References Cited

U.S. PATENT DOCUMENTS

| | | |
|---|---|---|
| 9,583,472 B2 | 2/2017 | Chung et al. |
| 9,711,379 B2 | 7/2017 | Yu et al. |
| 9,893,042 B2 | 2/2018 | Yu et al. |
| 9,953,892 B2 | 4/2018 | Kuo et al. |
| 10,157,900 B2 | 12/2018 | Liang et al. |
| 10,256,219 B2 | 4/2019 | Chew |
| 2010/0140779 A1* | 6/2010 | Lin .................. H01L 23/49827 257/690 |
| 2013/0069222 A1* | 3/2013 | Camacho .............. H01L 24/19 257/737 |
| 2019/0148342 A1* | 5/2019 | Hu ...................... H01L 25/105 257/659 |
| 2019/0273064 A1 | 9/2019 | Yu et al. |
| 2019/0387615 A1* | 12/2019 | Nikkhoo ............... G01J 1/4228 |

\* cited by examiner

SEMICONDUCTOR PACKAGE

CROSS-REFERENCE TO RELATED APPLICATION

This application claims priority under 35 U.S.C. § 119 to Korean Patent Application No. 10-2020-0093029, filed on Jul. 27, 2020, in the Korean intellectual Property Office, the disclosure of which is incorporated by reference herein in its entirety.

TECHNICAL HELD

The disclosure relates generally to a semiconductor package. More particularly, the present disclosure relates to a semiconductor package with increased space utilization and decreased size.

DISCUSSION OF RELATED ART

In the electronics industry, there is growing demand for semiconductor packages with decreased size and weight. Further, research has been conducted to include semiconductor chips with various functions in a semiconductor package and increase the speed of the semiconductor chips. Similarly, research continues into semiconductor packages that include semiconductor chips having stack structures. For example, when a second semiconductor chip and a passive element are mounted on a first semiconductor chip, effective arrangements of the first semiconductor chip, the second semiconductor drip, and the passive element and electrical connections between these components have been actively researched.

SUMMARY

An aspect of the present disclosure relates to a semiconductor package in which the spatial efficiency of a semiconductor chip, a passive element, and conductive posts and an electrical connection between the semiconductor chip and the passive element are increased.

Another aspect of the present disclosure relates to a semiconductor package having a reduced size.

Another aspect of the present disclosure relates to a semiconductor package with decreased warpage and increased reliability.

To accomplish the above purposes, a semiconductor package includes a first semiconductor chip including a first surface and a second surface, which faces the first surface, and including a first active layer on a portion adjacent to the first surface; a first redistribution structure on the first surface of the first semiconductor chip and connected to the first semiconductor chip, wherein the first redistribution structure includes a first area and a second area next to the first area; a second semiconductor chip mounted in the first area of the first redistribution structure, including a third surface proximate to the first surface, and a fourth surface opposite to the third surface, and including a second active layer on a portion adjacent to the third surface; conductive posts mounted in the second area of the first redistribution structure; a molding layer at least partially surrounding the second semiconductor chip and the conductive posts on the first redistribution structure; and a second redistribution structure disposed on the molding layer and connected to the conductive posts.

According to one or more example embodiments, a semiconductor package includes a first semiconductor chip including a first surface and a second surface opposite to the first surface, and including a first active layer on a portion adjacent to the first surface; a first redistribution structure disposed on a first surface of the first semiconductor chip and connected to the first semiconductor chip and including a first area and a second area that is next to the first area and is larger than the first area; a second semiconductor chip mounted on the first area of the first redistribution structure, including a third surface proximate to the first surface, and a fourth surface opposite to the third surface, and including a second active layer, which is formed on a portion adjacent to the third surface, and through electrodes penetrating at least a portion of the second semiconductor chip and connected to the second active layer; a passive element mounted in the first area of the first redistribution structure; conductive posts mounted in the second area of the first redistribution structure; a molding layer at least partially surrounding the second semiconductor chip, the passive element, and the conductive posts on the first redistribution structure; and a second redistribution structure disposed on the molding layer and connected to the through electrodes and the conductive posts of the second semiconductor chip.

According to one or more embodiments, a semiconductor package includes a package substrate; a semiconductor device mounted on the package substrate, wherein the semiconductor device includes: a first semiconductor chip including a first surface and a second surface opposite to the first surface and comprising a first active layer on a portion adjacent to the first surface; a first redistribution structure disposed on the first surface of the first semiconductor chip and comprising a first area and a second area located next to the first area; a second semiconductor chip mourned in the first area of the first redistribution structure, including a third surface opposite to the first surface, and a fourth surface proximate to the third surface, and including a second active layer on a portion adjacent to the third surface; conductive posts mounted in the second area of the first redistribution structure; a molding layer at least partially surrounding the second semiconductor chip and the conductive posts on the first redistribution structure; a second redistribution structure disposed on the molding layer and connected to the conductive posts; and a package connection terminal connecting the semiconductor device and the package substrate to each other.

The semiconductor package may include a semiconductor chip and a passive element in a first area and conductive posts in a second area next to the first area. Accordingly, an arrangement of the semiconductor chip, the passive element, and the conductive posts may be simplified, and space where the semiconductor chip, the passive element, and the conductive posts are disposed may be allow increased space utilization. Also, an electrical connection between the semiconductor chip and the passive element may be increased.

As the space where the semiconductor chip, the passive element, and the conductive posts are disposed may be utilized more efficiently, a size of the semiconductor package may be reduced.

Also, the semiconductor package may include a deformation prevention structure attached to the semiconductor chip, and thus, warpage of the semiconductor package may decrease.

BRIEF DESCRIPTION OF THE DRAWINGS

Embodiments of the inventive concept will be more clearly understood from the following detailed description with reference to the accompanying drawings in which.

DETAILED DESCRIPTION OF THE EMBODIMENTS

Figure 1:
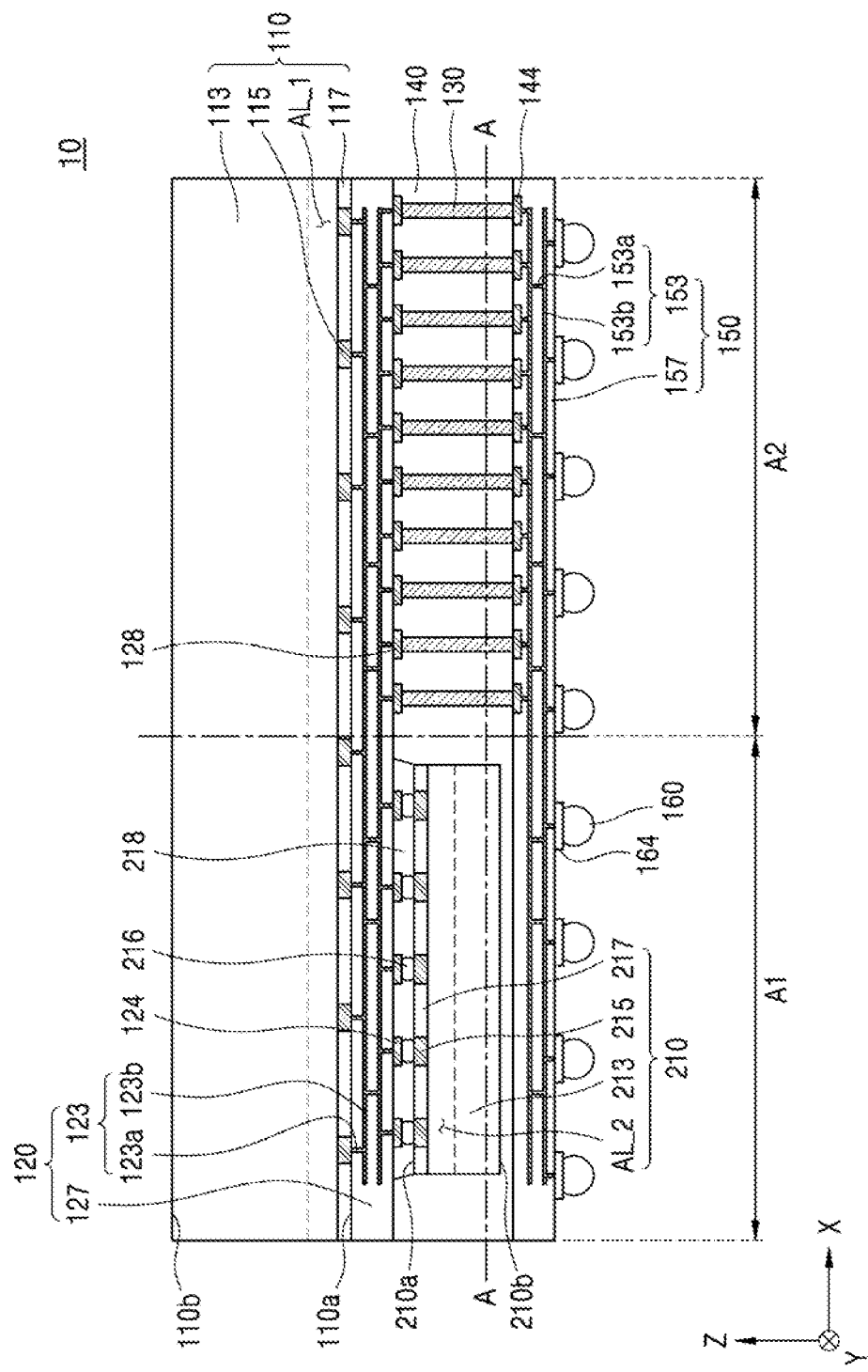
FIG. 1 is a cross-sectional view of a semiconductor package according to an example embodiment.

Hereinafter, various example embodiments of the inventive concept will be described in detail with reference to the attached drawings. Like reference symbols in the drawings may denote like elements, and to the extent that a description of an element has been omitted, it may be understood that the element is at least similar to corresponding elements that are described elsewhere in the specification.

Figure 2:
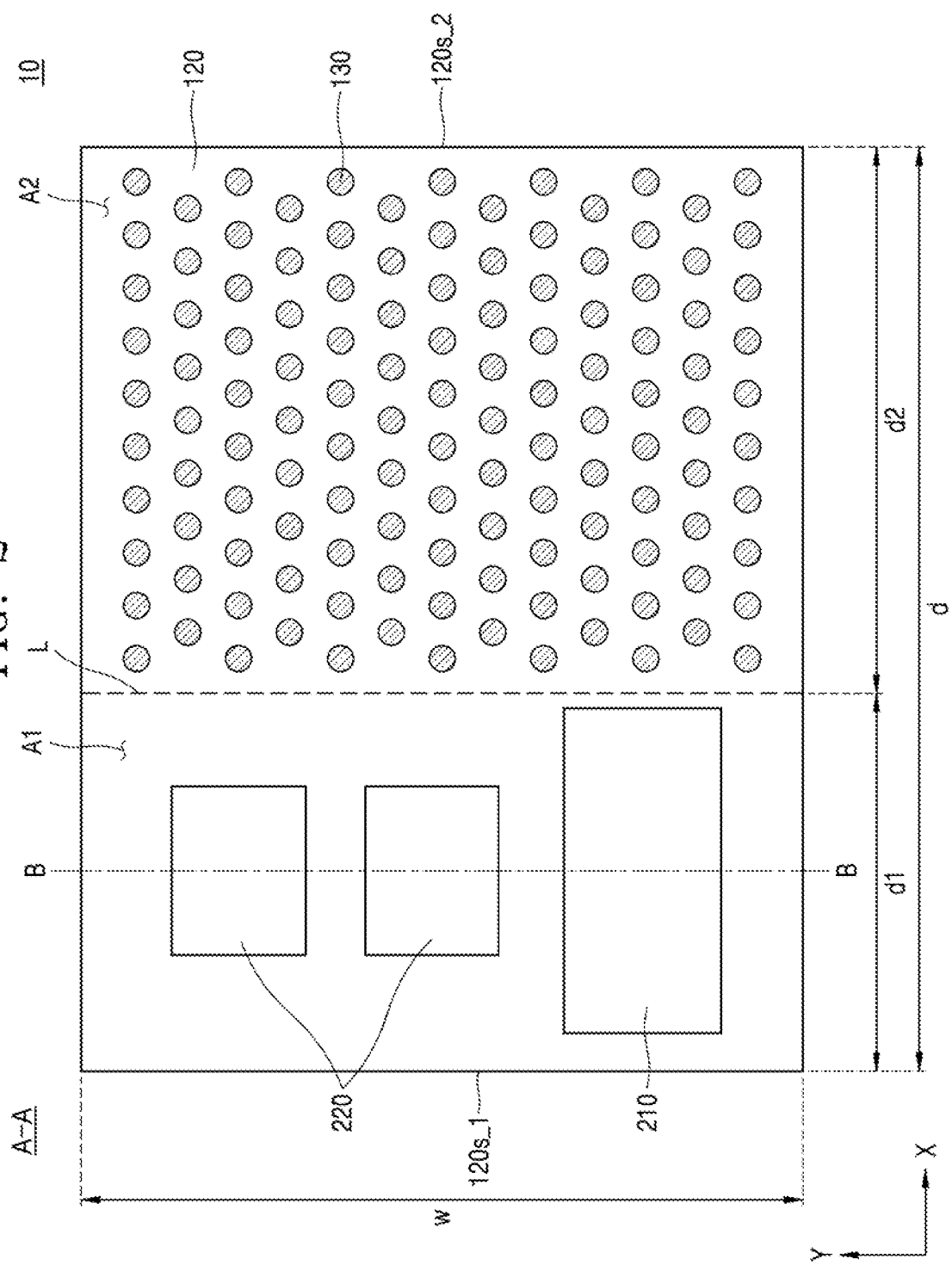
FIG. 2 is a cross-sectional view of a semiconductor package taken along a line A-A of FIG. 1.
Figure 3:
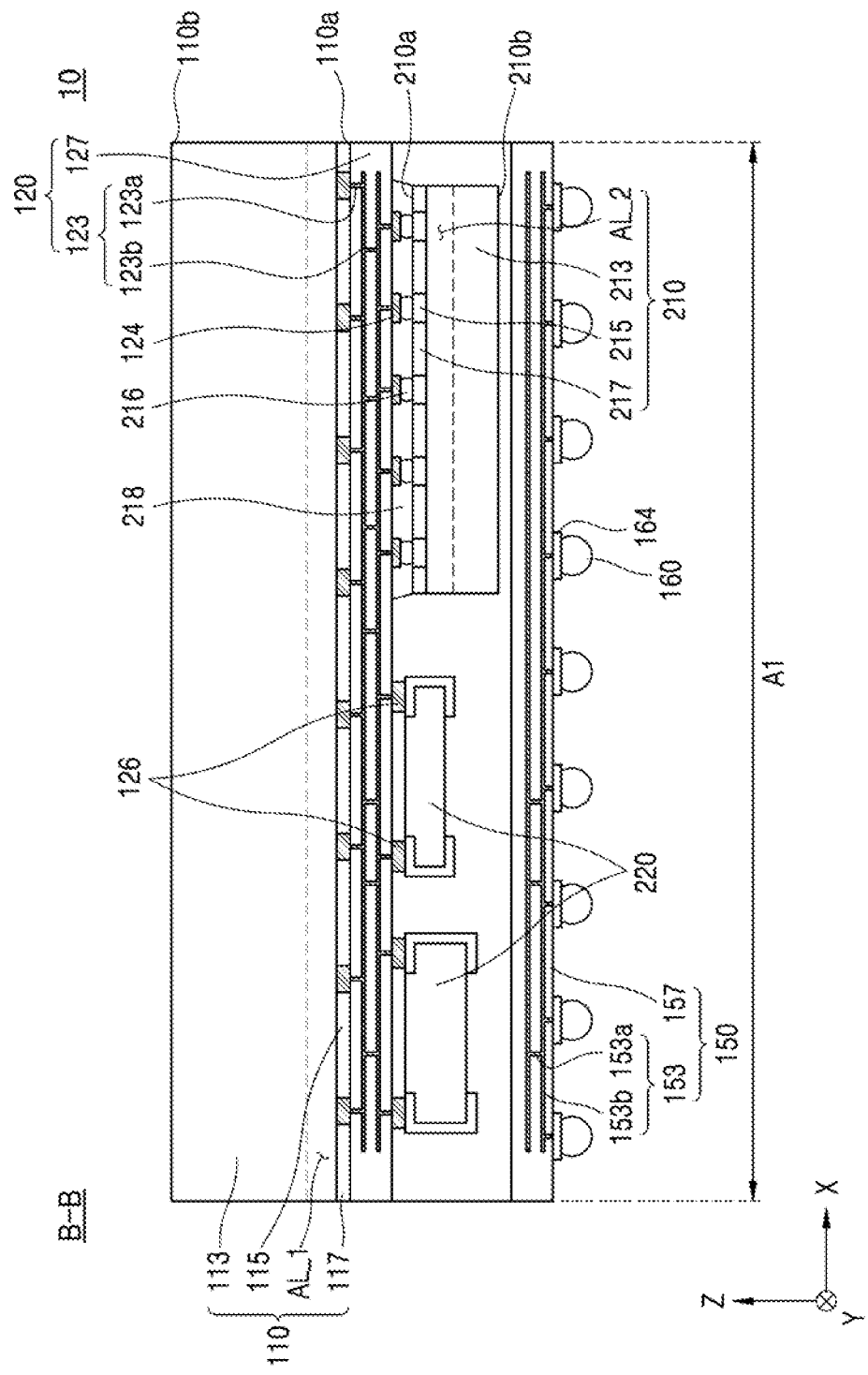
FIG. 3 is a cross-sectional view of a semiconductor package taken along a line B-B of FIG. 2.

FIG. 1 is a cross-sectional view of a semiconductor package 10 according to an example embodiment, FIG. 2 is a cross-sectional view of the semiconductor package 10 taken along a line A-A of FIG. 1, and FIG. 3 is a cross-sectional view of the semiconductor package 10 taken along a line B-B of FIG. 2.

The semiconductor package 10 according to an example embodiment may be a System In Package (SIP) in which first and second semiconductor chips 110 and 210 are electrically connected to each other and work as one system.

Referring to FIGS. 1 to 3, the semiconductor package 10 may include the first semiconductor chip 110, a first redistribution structure 120, the second semiconductor chip 210, passive elements 220, conductive posts 130, a first molding layer 140, a second redistribution structure 150, and package connection terminals 160.

The first semiconductor chip 110 may include a first semiconductor substrate 113 including a first active layer AL_1, first chip pads 115, and a first passivation layer 117. Also, the first semiconductor chip 110 may include a first surface 110a and a second surface 110b opposite to the first surface 110a. For example, the first surface 110a may be a lower surface of the first semiconductor chip 110, and the second surface 110b may be an upper surface of the first semiconductor chip 110.

In an example embodiment, the first semiconductor substrate 113 may include the first active layer AL_1 on a portion adjacent to the first surface 110a of the first semiconductor chip 110. The first active layer AL_1 may include various types of individual devices.

For example, the individual devices may include various microelectronic devices, for example, image sensors such as complementary metal-oxide semiconductor (CMOS) transistors, metal-oxide-semiconductor filed effect transistors (MOSFETs), system large scale integration (LSI), and CMOS imaging sensors (CISs), a micro-electro-mechanical systems (MEMS), an active element, a passive element, and the like.

In an example embodiment, the first semiconductor substrate 113 may include silicon (Si). Additionally or alternatively, the first semiconductor substrate 113 may include a semiconductor element such as germanium (Ge) or compounds such as silicon carbide (SiC), gallium arsenide (GeAs), indium arsenide (InAs), and indium phosphide (InP). However, materials of the first semiconductor substrate 113 are not necessarily limited thereto.

In an example embodiment, a size of the first semiconductor substrate 113 may be greater than that of a second semiconductor substrate 213. For example, a length of the first semiconductor substrate 113 in an X direction may be greater than a length of the second semiconductor substrate 213 in the X direction. Also, an area of the first semiconductor substrate 113 in the X-Y plane may be greater than that of the second semiconductor substrate 213.

In an example embodiment, a side surface of the first semiconductor substrate 113 may be aligned with a side surface of the semiconductor package 10. For example, the side surface of the first semiconductor substrate 113 may be on the same plane as a side surface of the first redistribution structure 120, a side surface of the first molding layer 140, and a side surface of the second redistribution structure 150.

The first chip pad 115 may be disposed on the first semiconductor substrate 113 and may be electrically connected to the individual devices in the first active layer AL_1 of the first semiconductor substrate 113. For example, there may be a plurality of chip pads 115 electrically connected to the individual devices in the first active layer AL_1 of the first semiconductor substrate 113. Unless otherwise prevented by context, description of the first chip pad 115 may be applied to a plurality of first chip pads 115. This may apply to any component where a plurality of such components are illustrated in the accompanying drawings.

In an example embodiment, the first chip pad 115 may include metal such as nickel (Ni), copper (Cu), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), or ruthenium (Ru), or an alloy thereof. However, materials of the first chip pad 115 are not necessarily limited thereto.

The first passivation layer 117 may be disposed on the first semiconductor substrate 113 to at least partially surround side surfaces of the first chip pad 115. Also, the first passivation layer 117 may expose one surface of the first chip pad 115. In an example embodiment, the first passivation layer 117 may include an insulating material such as an insulating polymer.

The first redistribution structure 120 may be disposed on the first surface 110a of the first semiconductor chip 110 and may be connected to the first semiconductor chip 110. The first redistribution structure 120 may include an upper surface contacting the first surface 110a of the first semiconductor chip 110 and a lower surface facing the upper surface and contacting the first molding layer 140.

In an example embodiment, the first redistribution structure 120 may include a first redistribution pattern 123, which is electrically connected to the first chip pad 115, and a first redistribution insulating layer 127 at least partially surrounding the first redistribution pattern 123.

In an example embodiment, the first redistribution insulating layer 127 may include an insulating material including a Photo imageable Dielectric (PID) used for a photolithography process. For example, the first redistribution insulating layer 127 may include photosensitive polyimide (PSPI). However, the present disclosure is not necessarily limited thereto. The first redistribution insulating layer 127 may include oxide or nitride. For example, the first redistribution insulating layer 127 may include silicon oxide or silicon nitride.

In an example embodiment, the first redistribution pattern 123 may be a conductive pattern electrically connected to the first chip pad 115 of the first semiconductor chip 110. For example, the first redistribution pattern 123 may include a first redistribution via pattern 123a, which extends in a vertical direction in the first redistribution insulating layer 127, and a first redistribution line pattern 123b extending in a horizontal direction in the first redistribution insulating layer 127.

In an example embodiment, the first redistribution pattern 123 may include metal such as Ni, Cu, Au, Ag, Al, W, Ti, Ta, In, Mo, Mn, Co, Sn, Mg, Re, Be, Ga, or Ru, or an alloy thereof.

When the first redistribution structure 120 is viewed on an X-Y plane, the first redistribution structure 120 may include a first area A1 and a second area A2 located next to the first area A1.

In an example embodiment, the first area A1 may be an area of the first redistribution structure 120 where the second semiconductor chip 210 and the passive element 220 are mounted, and the second area A2 may be an area of the first redistribution structure 120 where the conductive post 130 is mounted.

In an example embodiment, when the first redistribution structure 120 is viewed on a plane, a length of the first redistribution structure 120 in the X direction (that is, a length in a horizontal direction) may be defined as a length d in a first direction, and a length of the first redistribution structure 120 in a Y direction (that is, a length in a vertical direction) may be defined as a length w in a second direction. The second direction may be perpendicular to the first direction.

In an example embodiment, when the first redistribution structure 120 is viewed on a plane, a boundary L of the first area A1 and the second area A2 may be a line of intersection where the first area A1 and the second area A2 meet. For example, when the first redistribution structure 120 is viewed on a plane, the boundary L may be a virtual line extending in the Y direction and distinguishing the first area A1 and the second area A2 from each other.

In an example embodiment, an area from a side surface 120s_1 of the first redistribution structure 120 to the boundary L may be defined as the first area A1, and an area from the boundary L to the other side surface 120s_2 of the first redistribution structure 120 may be defined as the second area A2.

In an example embodiment, when the first redistribution structure 120 is viewed on a plane, the boundary L may extend between the second semiconductor chip 210 and the conductive post 130 in the Y direction. For example, the boundary L may extend in the Y direction and between a side surface of the second semiconductor chip 210 and a side surface of the conductive post 130 that is the closest to the second semiconductor chip 210.

Also, in an example embodiment, when the first redistribution structure 120 is viewed on a plane, the boundary L may extend between the passive element 220 and the conductive post 130 in the Y direction. For example, the boundary L may extend in the Y direction and between a side surface of the passive element 220 and the side surface of the conductive post 130 that is the closest to the passive element 220.

In an example embodiment, when the first redistribution structure 120 is viewed on an X-Y plane, a length from the side surface 120s_1 of the first redistribution structure 120 to the boundary L in the X direction may be defined as a length d1 of the first area A1 in the first direction, and a length of the first redistribution structure 120 from the other side surface 120s_2 to the boundary L in the X direction may be defined as a length d2 of the second area A2 in the first direction.

For example, the length d1 of the first area A1 in the first direction may be less than the length d2 of the second area A2 in the first direction. For example, the length d1 of the first area A1 in the first direction may be between about 10% and about 40% of the length d of the first redistribution structure 120 in the first direction. That is, the length from the side surface 120s_1 of the first redistribution structure 120 to the boundary L in the X direction may be between about 10% and about 40% of the length d of the first redistribution structure 120 in the first direction.

Also, the length d2 of the second area A2 in the first direction may be between about 60% and about 90% of the length d of the first redistribution structure 120 in the first direction. That is, the length from the other side surface 120s_2 of the first redistribution structure 120 to the boundary L in the X direction may be between about 60% and about 90% of the length d of the first redistribution structure 120 in the first direction.

In an example embodiment, when the first redistribution structure 120 is viewed on a plane, the first area A1 from the side surface 120s_1 of the first redistribution structure 120 to the boundary L may include the second semiconductor chip 210 and the passive element 220, but may not include the conductive post 130.

In an example embodiment, when the first redistribution structure 120 is viewed on a plane, the second area A2 from the other surface 120s_2 of the first redistribution structure 120 to the boundary L may include the conductive post 130, but may not include the second semiconductor chip 210 and the passive element 220.

Also, a sum of the length d1 of the first area A1 in the first direction and the length d2 of the second area A2 in the first direction may be substantially the same as the length d of the first redistribution structure 120 in the first direction (d1+d2=d).

For example, when the length d1 of the first area A1 in the first direction is about 30% of the length d of the first redistribution structure 120 in the first direction, the length d2 of the second area A2 in the first direction may be about 70% of the length d of the first redistribution structure 120 in the first direction.

The first area A1 may have the side surface 120s_1 of the first redistribution structure 120, and the second area A2 may have the other side surface 120s_2 that is opposite to the side surface 120s_1 of the first redistribution structure 120. A length in the second direction of the first area A1 and a length in the second direction of the second are A2 may be substantially the same as the length w of the first redistribution structure 120.

In an example embodiment, when the first redistribution structure 120 is viewed on an X-Y plane, an area of the first area A1 may be less than that of the second area A2. For example, the area of the first area A1 may be between about 10% and about 40% of the area of the first redistribution structure 120. Also, the area of the second area A2 may be between about 60% and about 90% of an area of the first redistribution structure 120.

For example, when the area of the first area A1 is about 30% of the area of the first redistribution structure 120, the area of the second area A2 may be about 70% of the area of the first redistribution structure 120.

Chip connection pad 124 may be disposed in the first area A1 of the first redistribution structure 120. The chip connection pad 124 may connect the second semiconductor chip 210 to the first redistribution structure 120. For example, the chip connection pad 124 may contact a first redistribution via pattern 123a in the first area A1 of the first redistribution structure 120.

Passive element connection pads 126 may be disposed in the first area A1 of the first redistribution structure 120. The passive element connection pad 126 may connect the passive element 220 to the first redistribution structure 120. For example, the passive element connection pad 126 may contact the first redistribution via pattern 123a in the first area A1 of the first redistribution structure 120.

First post connection pads 128 may be in the second area A2 of the first redistribution structure 120. The first post connection pad 128 may connect the conductive post 130 to the first redistribution structure 120. For example, the first post connection pad 128 may contact the first redistribution via pattern 123a in the second area A2 of the first redistribution structure 120.

The second semiconductor chip 210 may be mounted in the first area A1 of the first redistribution structure 120. In an example embodiment, the second semiconductor chip 210 may include the second semiconductor substrate 213 including a second active layer AL_2, second chip pads 215, and a second passivation layer 217. Also, the second semiconductor chip 210 may include a third surface 210a facing the first surface 110a of the first semiconductor chip 110 and a fourth surface 210b facing the third surface 210a.

In an example embodiment, the second semiconductor substrate 213 may include the second active layer AL_2 on a portion adjacent to the third surface 210a. Accordingly, the second active layer AL_2 of the second semiconductor chip 210 may be proximate to the first active layer AL_1 of the first semiconductor chip 110, and an electrical path distance between the first and second semiconductor chips 110 and 210 may decrease.

In an example embodiment, the first semiconductor chip 110 may be different from the second semiconductor chip 210. In an example embodiment, the first semiconductor chip 110 may include a logic semiconductor chip. The logic semiconductor chip may include a semiconductor chip such as a Central Processing Unit (CPU), a Micro Processor Unit (MPU), a Graphic Processor. Unit (GPU), or an Application Processor (AP), or the like.

The second semiconductor chip 210 may include a memory semiconductor chip. The memory semiconductor chip may include, for example, a volatile memory semiconductor Chip such as Dynamic Random Access Memory (DRAM) or Static Random Access Memory (SRAM) and a non-volatile memory semiconductor chip such as Phase-change Random Access Memory (PRAM), Magneto-resistive Random Access Memory (MRAM), Ferroelectric Random Access Memory (FeRAM), or Resistive Random Access Memory (RRAM).

However, the present disclosure is not necessarily limited thereto. The first semiconductor chip 110 may be a memory semiconductor chip, and the second semiconductor chip 210 may be a logic semiconductor chip. Also, the first semiconductor chip 110 and the second semiconductor chip 210 may be of the same type.

The chip connection terminal 216 may be disposed between the second chip pad 215 of the second semiconductor chip 210 and the chip connection pad 124. The chip connection pad 216 may be a terminal that electrically connects the second chip pad 215 of the second semiconductor chip 210 to the first redistribution pattern 123 of the first redistribution structure 120.

An adhesive layer 218 may be disposed between the third surface 210a of the second semiconductor chip 210 and a lower surface of the first redistribution structure 120 and may fix the second semiconductor device 210 on the first redistribution structure 120.

In an example embodiment, the adhesive layer 218 may cover the third surface 210a of the second semiconductor device 210 and at least partially surround the side surface of the chip connection terminal 216. The adhesive layer 218 may be a non-conductive film (NCF) and may include, for example, an insulating polymer.

The passive element 220 may be mounted in the first area A1 of the first redistribution structure 120. In an example embodiment, the passive element 220 may include at least one of: a capacitor, a resistor, and an inductor. The passive element may be electrically connected to the second semiconductor chip 210.

In an example embodiment, because both the passive element 220 and the second semiconductor chip 210 may be disposed in the first area A1 of the first redistribution structure 120, a layout of the passive element 220 and the second semiconductor chip 210 may be simplified.

Accordingly, the reliability of the electrical connection between the second semiconductor chip 210 and the passive element 220 may be increased, and an electrical path distance between the second semiconductor chip 210 and the passive element 220 may decrease.

The conductive post 130 may be in the second area A2 of the first redistribution structure 120 and may be connected to the first post connection pad 128. The conductive post 130 may be disposed between the first redistribution structure 120 and the second redistribution structure 150 and may connect the first redistribution structure 120 and the second redistribution structure 150 to each other.

In an example embodiment, the conductive post 130 may extend from one surface of the first post connection pad 128 and may penetrate the first molding layer 140 in a vertical direction (that is, a Z direction). The above vertical direction (the Z direction) may be perpendicular to the lower surface of the first redistribution structure 120.

In an example embodiment, a length of the conductive post 130 in the vertical direction (the Z direction) may be greater than the lengths of the second semiconductor chip 210 and the passive element 220 in the vertical direction. For example, the length of the conductive post 130 in the vertical direction may be substantially the same as the length of the first molding layer 140 in the vertical direction, and the lengths of the second semiconductor chip 210 and the passive element 220 in the vertical direction may each be less than the length of the first molding layer 140 in the vertical direction.

In an example embodiment, the conductive posts 130 may be arranged in a honeycomb shape or a zigzag pattern in the second area A2 of the first redistribution structure 120. Also, FIG. 2 shows that the shape of the conductive post 130 as a cylinder, but may be a poly-prism.

In an example embodiment, the conductive post 130 may be in the second area A2, and thus, an arrangement of the conductive posts 110 may not interfere with an arrangement of the second semiconductor chip 210 and the passive element 220. Accordingly, the conductive posts 130 may be arranged in the second area A2.

The first molding layer 140 may be disposed on the first redistribution structure 120 and may at least partially surround the second semiconductor chip 210, the passive element 220, and the conductive posts 130. In an example embodiment, the first molding layer 140 may include a material including an Epoxy Molding Compound (EMC). However, a molding material is not limited to the EMC and may include various materials such as an epoxy-based material, a thermosetting material, a thermoplastic material, and a treatment material.

In an example embodiment, the first molding layer 140 may cover a side surface and a fourth surface 210b of the second semiconductor chip 210. The first molding layer 140 may also at least partially surround the side surface of the conductive post 130, but may expose a surface thereof. In other words, a surface of the first molding layer 140 may be disposed on the same plane as one surface of the conductive post 130.

The second post connection pad 144 may be disposed on the conductive post 130 and may be at least partially surrounded by the second redistribution structure 150. The second post connection pad 114 may connect the conductive post 130 and the second redistribution structure 150 to each other. For example, the second post connection pad 144 may contact a second redistribution via pattern 153a of a second redistribution pattern 153 of the second redistribution structure 150.

The second redistribution structure 150 may be disposed on the first molding layer 140 and may be connected to the conductive post 130. The second redistribution structure 150 may include an upper surface, which faces the first molding layer 140, and a lower surface which faces the upper surface and to which the package connection terminal 160 is attached.

In an example embodiment, the second redistribution structure 150 may include the second redistribution pattern 153, which is electrically connected to the conductive post 130, and a second redistribution insulating layer 157 which at least partially surrounds the second redistribution pattern 153.

In an example embodiment, the second redistribution insulating layer 157 may include an insulating material including the PID used for a photolithography process. For example, the second redistribution insulating layer 157 may include photosensitive polyimide. However, the material of the second redistribution insulating layer 157 is not necessarily limited thereto and may include oxide or nitride. For example, the second redistribution insulating layer 157 may include silicon oxide or silicon nitride.

In an example embodiment, the second redistribution pattern 153 may be a conductive pattern that is electrically connected to the conductive post 130. For example, the second redistribution pattern 153 may include the second redistribution via pattern 153a, which extends in the second redistribution insulating layer 157 in the vertical direction, and a second redistribution line pattern 153b which extends in the second redistribution insulating layer 157 in the horizontal direction.

In an example embodiment, the material of the second redistribution pattern 153 may include metal such as Ni, Cu, Au, Ag, Al, W, Ti, Ta, Mo, Mn, Co, Sn, Mg, Re, Be, Ga, or Ru, or an alloy thereof.

Package connection pads 164 may connect the second redistribution pattern 153 to the package connection terminal 160. The package connection pad 164 may be disposed on a lower portion of the second redistribution insulating layer 157 to contact the second redistribution via pattern 153b.

Figure 7:
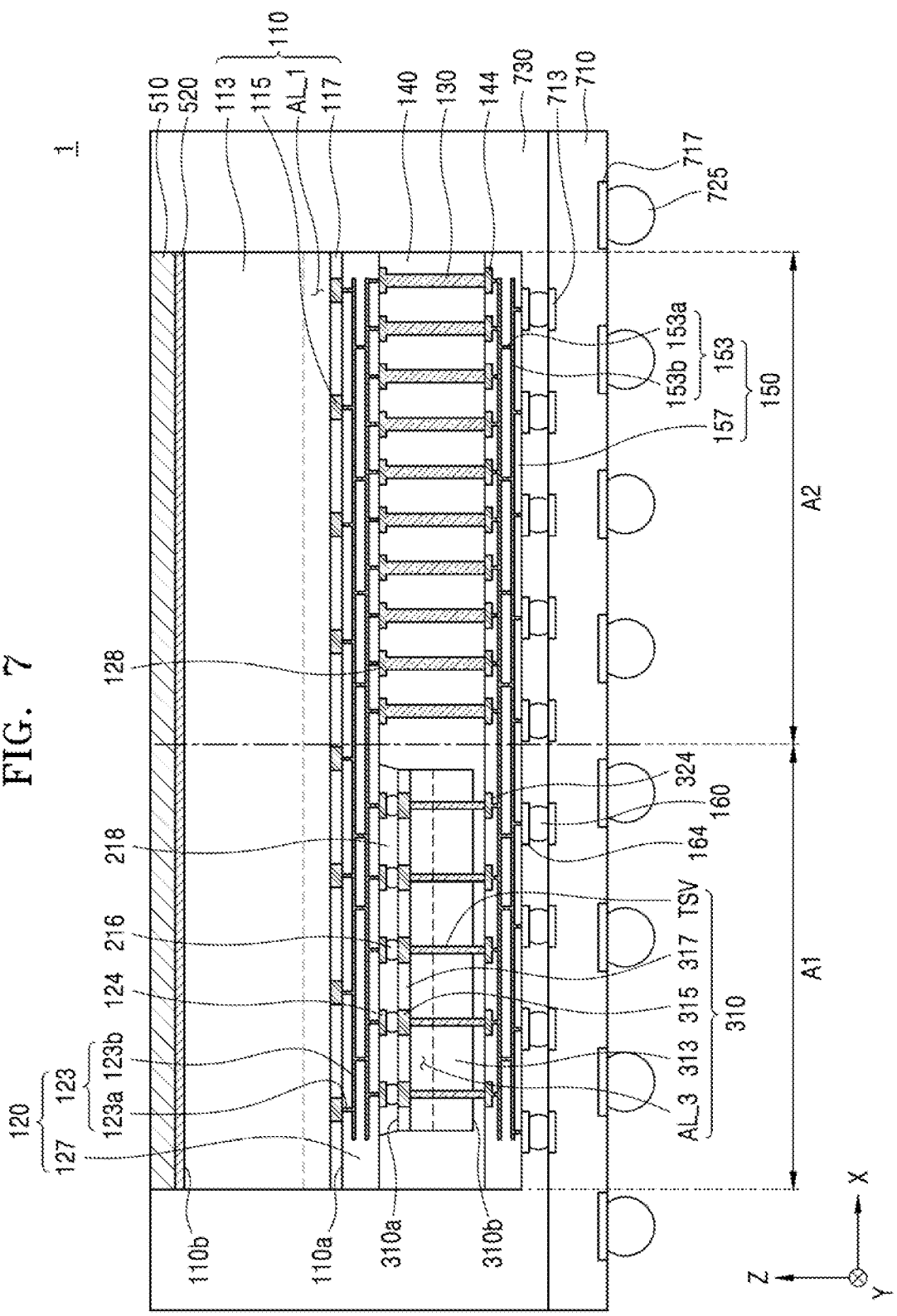
FIG. 7 is a cross-sectional view of a semiconductor package according to an example embodiment.

The package connection terminal 160 may provide for electrical connection between the semiconductor package 10 and a package substrate 710 (of FIG. 7). In an example embodiment, the package connection terminal 160 may be attached to the package connection pad 164. The package connection terminal 160 may be a solder ball that includes a metal material including at least one of Sn, Ag, Cu, and Al, though the present disclosure is not necessarily limited thereto.

The semiconductor package 10 according to an example embodiment may include the first redistribution structure 120 that includes the first area A1, where the second semiconductor chip 210 and the passive element 220 are mounted, and the second area A2 which is next to the first area A1 and where the conductive posts 130 are mounted.

Because the first area A1 and the second area A2 of the first redistribution structure 120 may be separated from each other, the arrangement of the second semiconductor chip 210 and the passive element 220 in the first area A1 and the arrangement of the conductive posts 130 in the second area A2 may be simplified. Accordingly, space where the second semiconductor chip 210, the passive element 220, and the conductive posts 130 are placed may be utilized more efficiently, and a size of the semiconductor package 10 may be reduced.

Also, because both the second semiconductor chip 210 and the passive element 220 may be disposed in the first area A1, the electrical connection between the second semiconductor chip 210 and the passive element 220 may be simplified, and the electrical path distance between these components may decrease.

Also, because the conductive posts 130 may be disposed in the second area A2, the arrangement of the conductive posts 130 might not interfere with the arrangement of the second semiconductor chip 210 and the passive element 220.

Figure 4:
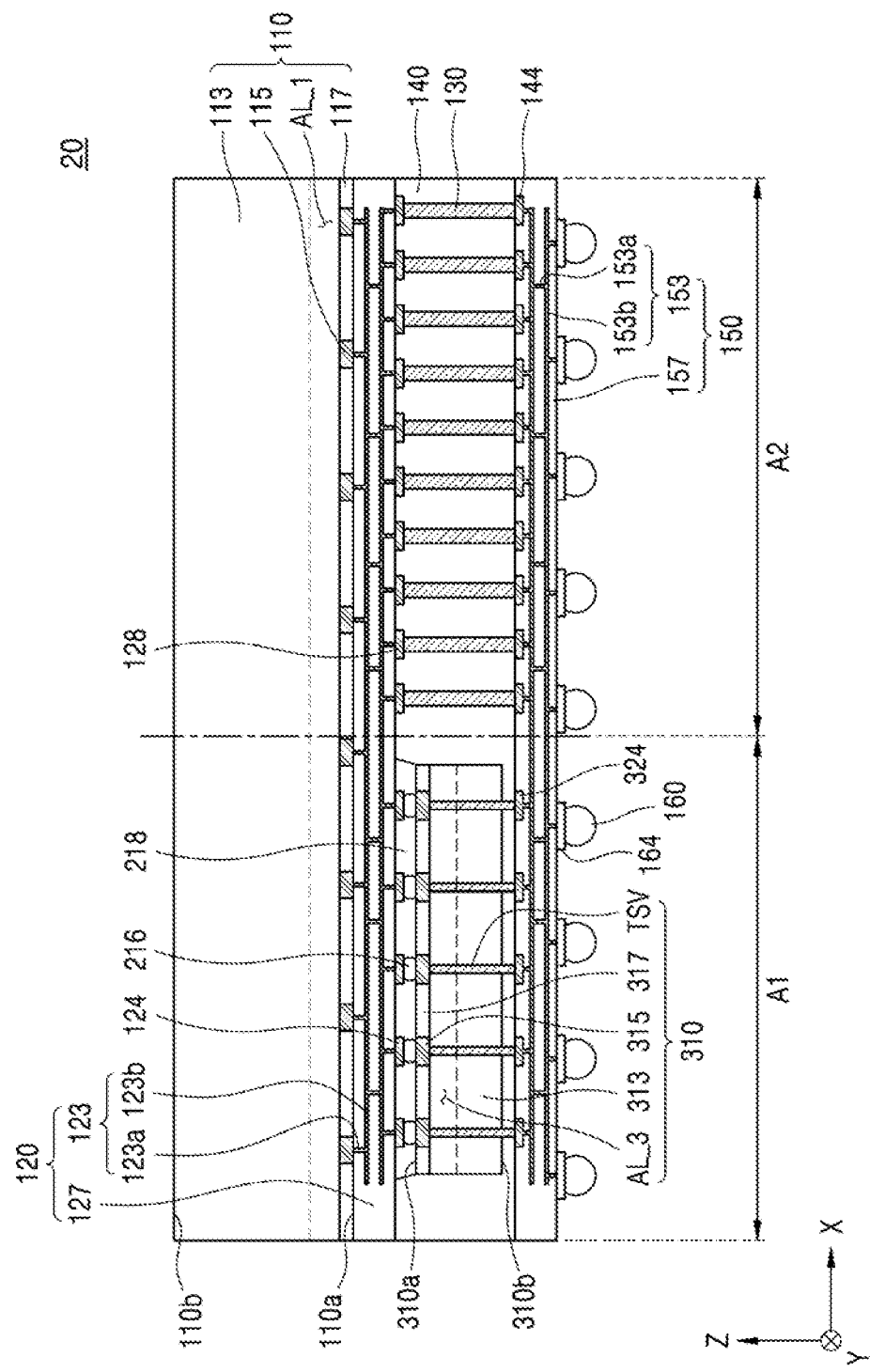
FIG. 4 is a cross-sectional view of a semiconductor package according to an example embodiment.

FIG. 4 is a cross-sectional view of a semiconductor package 20 according to an example embodiment.

Referring to FIG. 4, the semiconductor package 20 according to an example embodiment may include the first semiconductor chip 110, the first redistribution structure 120, a third semiconductor chip 310, the passive element 220, the conductive posts 130, the first molding layer 140 the second redistribution structure 150, the package connection terminal 160, and the like.

Hereinafter, the descriptions of the semiconductor package 20 of FIG. 4 and the semiconductor package 10 of FIG. 1 may be applied to like elements, and an differences will be described.

In an example embodiment, the third semiconductor chip 310 may be mounted in the first area A1 of the first redistribution structure 120. The third semiconductor chip 310 may include a third semiconductor substrate 313 including a third active layer AL_3, third chip pads 315, a third passivation layer 317, and through electrodes TSV.

Also, the third semiconductor chip 310 may include a fifth surface 310a, which proximate to the first surface 110a of the first semiconductor chip 110, and a sixth surface 310b opposite the fifth surface 310a.

In an example embodiment, the third substrate 313 may include the third active layer AL_3 on a portion adjacent to the fifth surface 310a. Accordingly the third active layer AL_3 of the third semiconductor chip 310 and the first active layer AL_1 of the first semiconductor chip 110 may be proximate to each other, and an electrical path distance between the first semiconductor chip 110 and the third semiconductor chip 310 may decrease.

In an example embodiment, the through electrode TSV may penetrate the third semiconductor substrate 313 in the vertical direction and may be connected to the individual devices in the third active layer AL_3. For example, one side of the through electrode TSV may be connected to the third active layer AL_3, and the other side may be connected to the second redistribution pattern 153 of the second redistribution structure 150.

FIG. 4 shows that the through electrode TSV completely penetrates the third semiconductor substrate 313 and contacts the third chip pad 315, but the present disclosure is not necessarily limited thereto. The through electrode TSV may penetrate only a portion of the third semiconductor substrate 313 and thus may not contact the third chip pad 315.

In an example embodiment, the through electrode TSV may protrude from the sixth surface 310b of the third semiconductor chip 310. A portion of the through electrode TSV protruding from the sixth surface 310b of the third semiconductor chip 310 may be at least partially surrounded by the first molding layer 140.

In an example embodiment, the through electrode TSV may have a cylindrical shape. The through electrode TSV may include a barrier layer formed on a surface of a column and a buried conductive layer filling the inside of the barrier layer.

Through electrode connection pads 324 may be disposed on the through electrode TSV and may be at least partially surrounded by the second redistribution structure 150. The through electrode connection pad 324 may connect the through electrode TSV to the second redistribution structure 150. For example, the through electrode connection pad 324 may contact the second redistribution via pattern 153a of the second redistribution pattern 153 of the second redistribution structure 150.

In an example embodiment, because the third semiconductor chip 310 may include the through electrode TSV that electrically connects the third active layer AL_3 to the second redistribution pattern 153, an electrical path distance between the third semiconductor chip 310 and the second redistribution structure 150 may decrease.

Figure 5:
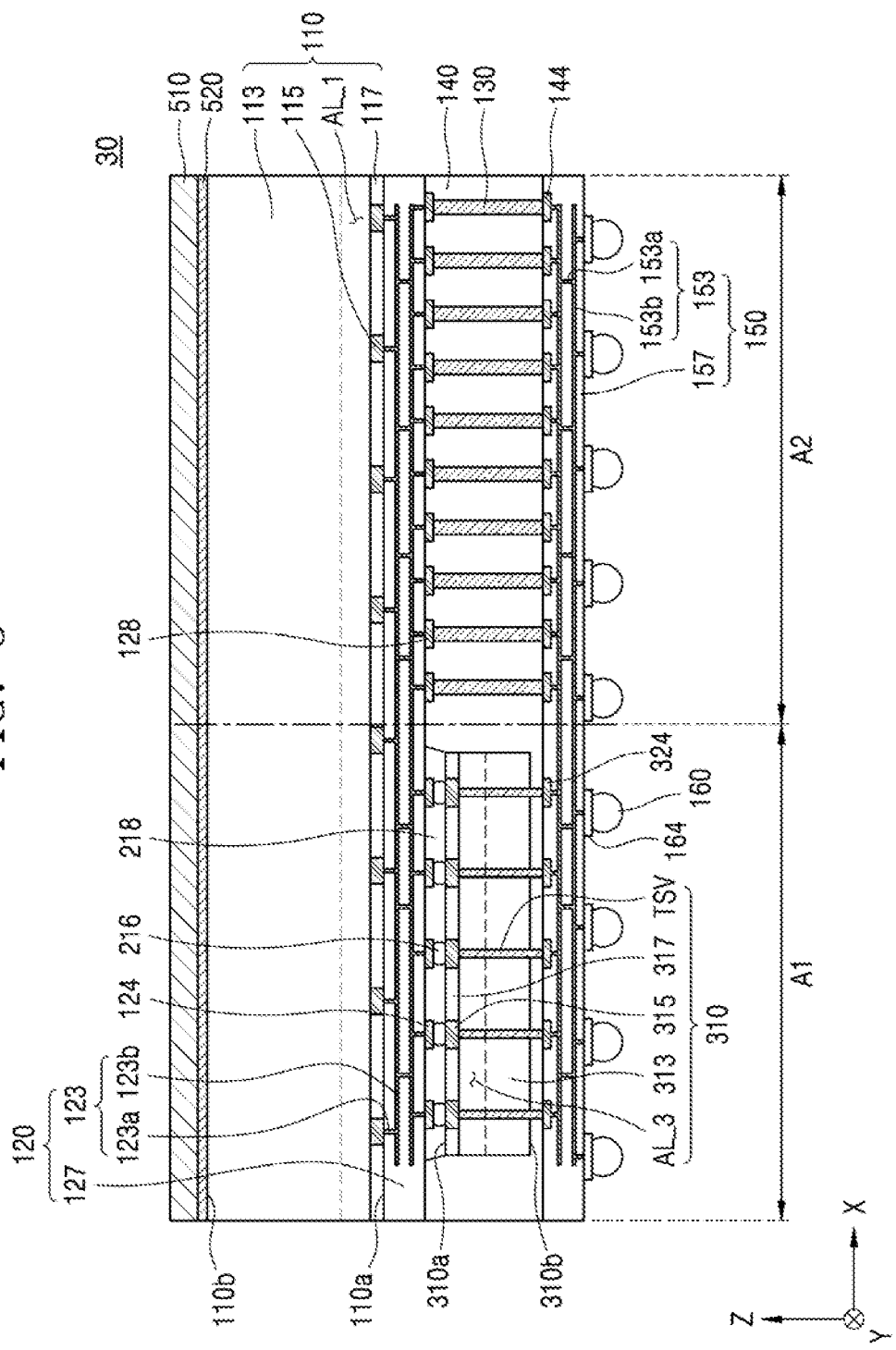
FIG. 5 is a cross-sectional view of a semiconductor package according to air example embodiment.

FIG. 5 is a cross-sectional view of a semiconductor package 30 according to an example embodiment.

Referring to FIG. 5, the semiconductor package 30 may include the first semiconductor chip 110, the first redistribution structure 120, the third semiconductor chip 310, the passive element 220, the conductive posts 130, the first molding layer 140, the second redistribution structure 150, the package connection terminal 160, and a deformation prevention structure 510.

Hereinafter, the descriptions of the semiconductor package 30 of FIG. 5 and the semiconductor package 10 of FIG. 1 may be applied to like elements, and differences will be described.

Referring to the semiconductor package 10 of FIG. 1, the second semiconductor chip 210 and the passive element 220 may be mounted in the first area A1 of the first redistribution structure 120, and the conductive posts 130 may be mounted in the second area A2. Accordingly, a structure of the semiconductor package 10 of FIG. 1 may be asymmetrical relative to the center of the semiconductor package 10, and a center of gravity of the semiconductor package 10 may be on an edge portion of the semiconductor package 10.

Also, the material forming the conductive posts 130 may have greater thermal conductivity than the materials forming the second semiconductor chip 210 and the passive element 220, and accordingly, heat generated in the semiconductor package 10 may be concentrated in a portion near the second area A2 of the first redistribution structure 120.

The center of gravity of the semiconductor package 10 of FIG. 1 may be on the edge portion of the semiconductor package 10 and the heat generated in the semiconductor package 10 may be concentrated in the portion around the second area A2. Thus, the semiconductor package 20 may be warped during manufacture or may be warped due to external impact.

To prevent warpage, the semiconductor package 30 of FIG. 5 may further include the deformation prevention structure 510 attached to the second surface 110b of the first semiconductor chip 110. The deformation prevention structure 510 may be attached to the second surface 110b of the first semiconductor chip 110 by an adhesive material 520 to prevent warpage of the semiconductor package 30.

In an example embodiment, the deformation prevention structure 510 may fully cover the second surface 110b of the first semiconductor chip 110. Also, a surface of the deformation prevention structure 510 may be on the same plane as the side surface of the semiconductor package 30.

In an example embodiment, a coefficient of thermal expansion (CTE) of a material forming the deformation prevention structure 510 may be less than a CTE of a material forming the first semiconductor chip 110. For example, when the first semiconductor chip 110 includes a silicon material, the deformation prevention structure 510 may include a material with a CTE less than that of silicon.

Also, in an example embodiment, the rigidity of the material forming the deformation prevention structure 510 may be greater than the rigidity of the material forming the first semiconductor chip 110. For example, when the first semiconductor chip 110 includes a silicon material, the deformation prevention structure 510 may include a material with a rigidity greater than that of silicon.

The first redistribution structure 120 of the semiconductor package 30 may include the first area A1 and the second area A2 next to the first area A1 and larger than the first area A1, and thus, the arrangement of the second semiconductor chip 210 and the passive element 220 in the first area A1 and the an of the conductive posts 130 in the second area A2 may be simplified. Accordingly, a size of the semiconductor package 30 according to an example embodiment may be reduced.

Because the second semiconductor chip 210 and the passive element 220 of the semiconductor package 30 may be disposed in the first area A1, the electrical connection between the second semiconductor chip 210 and the passive element 220 may be simplified, and the electrical path distance between the second semiconductor chip 210 and the passive element 220 may decrease.

Because the conductive posts 130 of the semiconductor package 30 may be disposed in the second area A2, the arrangements of the conductive posts 130 may not interfere with the arrangement of the second semiconductor chip 210 and the passive element 220.

Also, because the semiconductor package 30 may include the deformation prevention structure 510 attached to the first semiconductor chip 110, warpage of the semiconductor package 30 may decrease.

Figure 6:
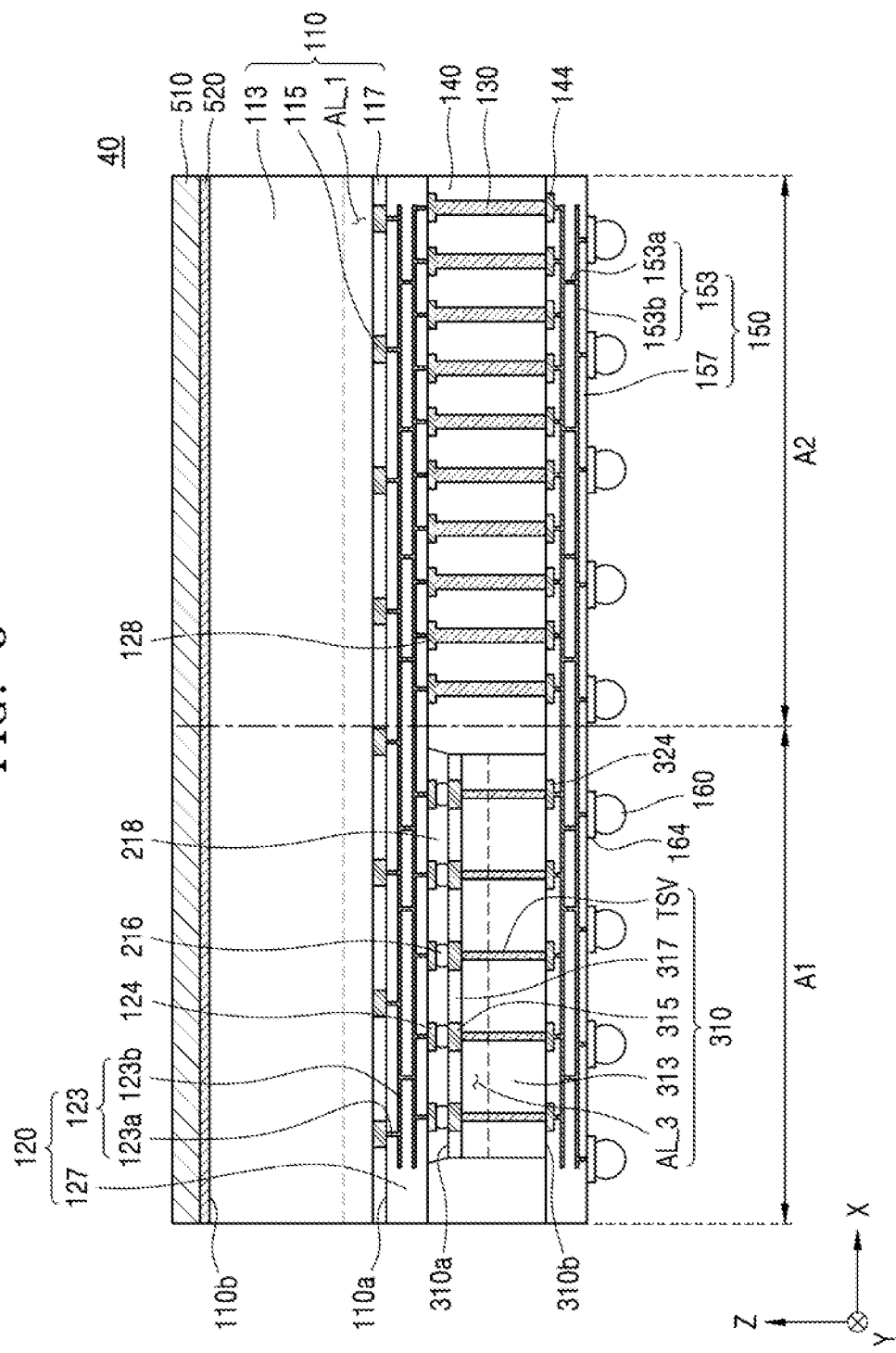
FIG. 6 is a cross-sectional view of a semiconductor package according to an example embodiment.

FIG. 6 is a cross-sectional view of a semiconductor package 40 according to an example embodiment.

Referring to FIG. 6, the semiconductor package 40 according to an example embodiment may include the first semiconductor chip 110, the first redistribution structure 120, the third semiconductor chip 310, the passive element 220, the conductive posts 130, the first molding layer 140, the second redistribution structure 150, the package connection terminal 160, and the deformation prevention structure 510.

Hereinafter, the repetitive descriptions of the semiconductor package 40 of FIG. 6 and the semiconductor chip 30 of FIG. 5 will be omitted, and differences will be described.

In an example embodiment, the sixth surface 310b of the third semiconductor chip 310 may be supported by the second redistribution structure 150. In other words, the sixth surface 310b of the third semiconductor chip 310 may not be covered by the first molding layer 140 and may contact an upper surface of the second redistribution structure 150.

Also, the sixth surface 310b of the third semiconductor chip 310, a surface of the conductive post 130, and the upper surface of the second redistribution structure 150 may be on the same plane. Also, the through electrode TSV of the third semiconductor chip 310 may not protrude from the sixth surface 310b, and accordingly a surface of the through electrode TSV may be on the same plane as the sixth surface 310b.

Because the third semiconductor chip 310 of the semiconductor package 40 according to an example embodiment may be supported by the first molding layer 140, the structural reliability of the semiconductor package 40 may be increased.

FIG. 7 is a cross-sectional view of a semiconductor package 1 according to an example embodiment. The semiconductor package 1 of FIG. 7 may include the package substrate 710, a semiconductor device 30 mounted on the package substrate 710, and a second molding layer 730. The concept of the semiconductor device 30 is substantially the same as the semiconductor package 30 of FIG. 5, and thus, detailed descriptions thereof will be omitted.

The package substrate 710 may be a substrate on which the semiconductor package 30 is mounted. In an example embodiment, the package substrate 710 may be a double-sided pinned circuit board (PCB) that includes first substrate pads 713 and second substrate pads 717 on both surfaces of the package substrate 710.

However, the present disclosure is not necessarily limited thereto, and the package substrate 710 may be a one-sided PCB that includes substrate pads on one side of the package substrate 710. The package substrate 710 may not be limited to a structure and materials of a PCB and may include, for example, various substrates such as a ceramic substrate.

In an example embodiment, external connection terminals 725 for connection with an external device may be attached to the package substrate 710. The external connection terminal 725 may be attached to the second substrate pad 717 that is disposed on a lower surface of the package substrate 710. For example, the external connection terminal 725 may be a solder ball that includes a metal material including at least one of Sn, Ag, Cu and Al.

In an example embodiment, the package connection terminal 160 of the semiconductor package 30 may be attached to the first substrate pad 713 disposed on an upper surface of the package substrate 710. The semiconductor package 30 may be electrically connected to the package substrate 710 by the package connection terminal 160.

The second molding layer 730 may at least partially surround the semiconductor device 30 on the package substrate 710. The second molding layer 730 may fix the semiconductor device 30 on the package substrate 710.

In an example embodiment, the second molding layer 730 may include an EMC. However, the material of the second molding layer 730 is not necessarily limited thereto and may include various materials such as an epoxy-based material, a thermosetting material, a thermoplastic material, and a UV treatment material.

In an example embodiment, the second molding layer 730 may at least partially surround a side surface of the semiconductor device 30, but may expose an upper surface of the semiconductor device 30. In other words, the second molding layer 730 may expose the deformation prevention structure 510 of the semiconductor device 30 to the outside. For example, an upper surface of the second molding layer 730 may be on the same plane as the upper surface of the deformation prevention structure 510. However, the present disclosure is not necessarily limited thereto, and the second molding layer 730 may at least partially surround the side and upper surfaces of the semiconductor device 30, including the deformation prevention structure 510.

Hereinafter, a manufacturing method of a semiconductor package will be described in more detail with reference to the attached drawings.

Figure 8:
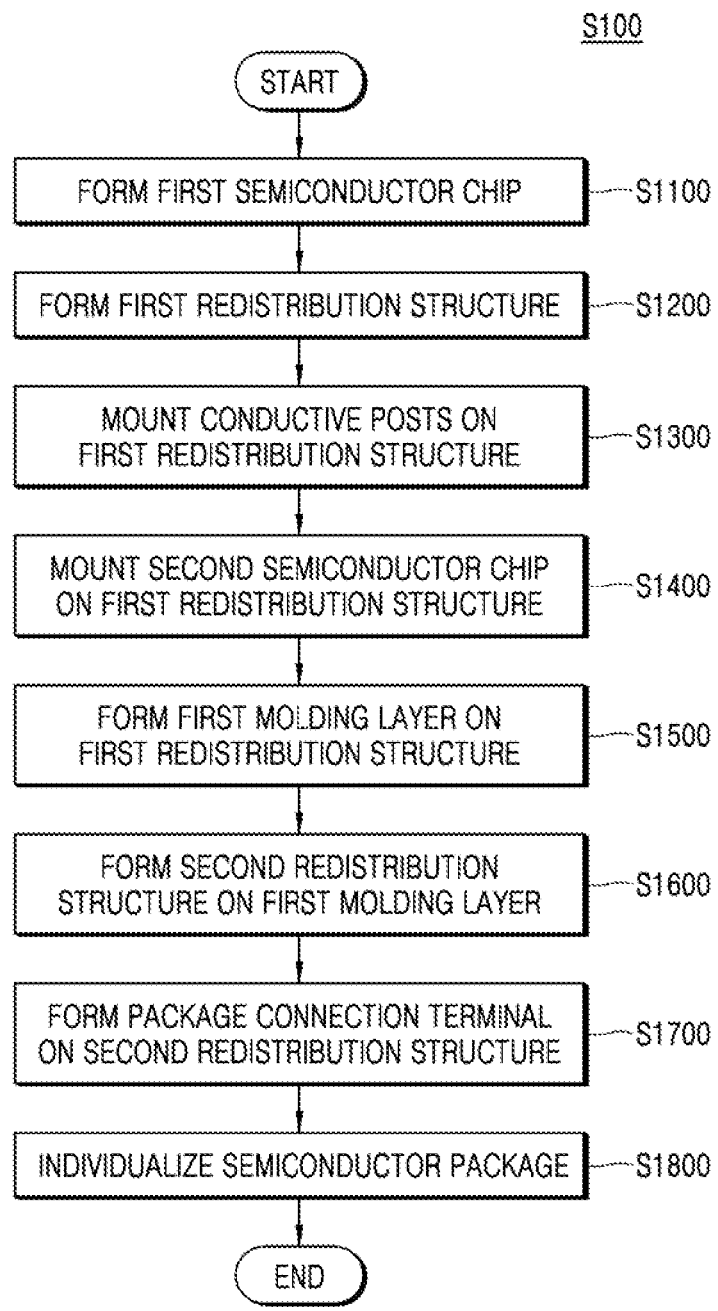
FIG. 8 is a flowchart of a manufacturing method of a semiconductor package, according to an example embodiment.

FIG. 8 is a flowchart of a manufacturing method S100 of a semiconductor package, according to an example embodiment. FIGS. 9 to 16 show operations of the manufacturing method S100 of the semiconductor package, according to an example embodiment. The manufacturing method S100 of the semiconductor package may be a manufacturing method of the semiconductor package 20 of FIG. 4.

The manufacturing method S100 of the semiconductor package may include forming the first semiconductor chip 110 (S1100), forming the first redistribution structure 120 (S1200), mounting the conductive posts 130 on the first redistribution structure 120 (S1300), mounting the second semiconductor chip 210 on the first redistribution structure 120 (S1400), forming the first molding layer 140 on the first redistribution structure 120 (S1500), forming the second redistribution structure 150 on the first molding layer 140 (S1600), forming the package connection terminal 160 on the second redistribution structure 150 (S1700), and individualizing a semiconductor package (S1800).

In an example embodiment, the manufacturing method S100 of the semiconductor package may be performed at a wafer level. In detail, the manufacturing method S100 of the semiconductor package may include manufacturing semiconductor packages at the wafer level and individualizing the semiconductor packages into individual semiconductor packages.

Figure 9:
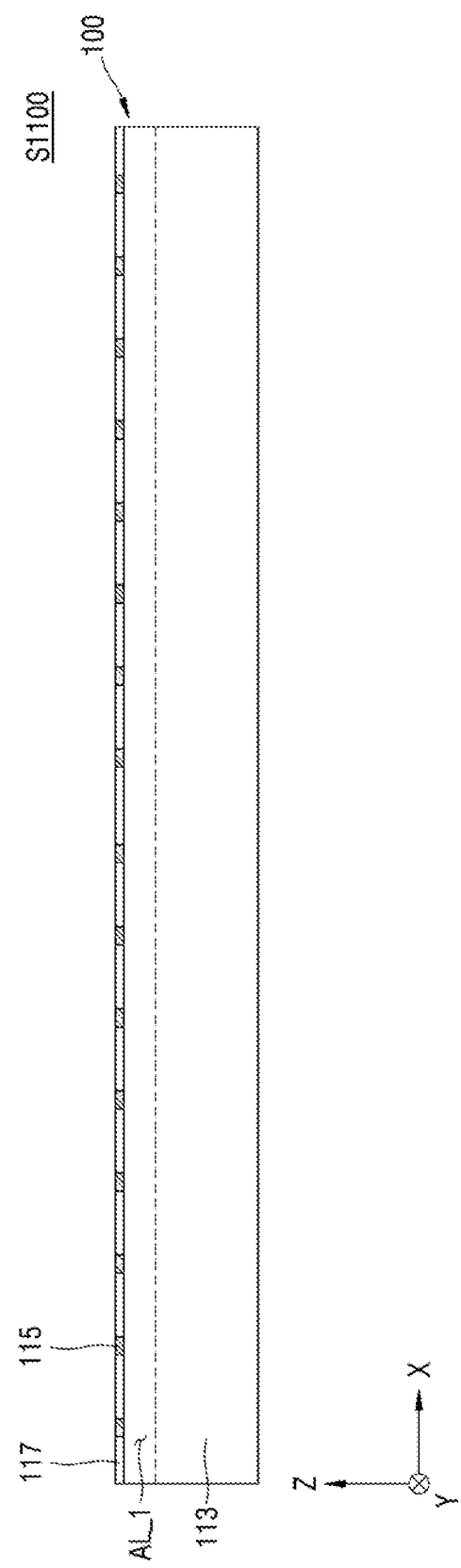
FIGS. 9 to 16 are diagrams respectively showing operations of a manufacturing method of a semiconductor package, according to an example embodiment.

Referring to FIGS. 8 and 9, the manufacturing method S100 of the semiconductor package may include forming the first semiconductor chip 110 (S1100). For example, the forming of the first semiconductor chip 110 (S1100) may be performed at the wafer level or a panel level.

Operation S1100 may include forming the first active layer AL_1 on the first semiconductor substrate 113, mounting first chip pads 115 on the first semiconductor substrate 113, and forming the first passivation layer 117 on the first semiconductor substrate 113.

In an example embodiment, the first semiconductor substrate 113 may include a silicon material. However, the present disclosure is not necessarily limited thereto, and the first semiconductor substrate 113 may include a semiconductor element such as Ge or compounds such as SW, GaAs, InAs, and InP.

In an example embodiment, the forming of the first active layer AL_1 on the first semiconductor substrate 113 may include forming individual devices on the first semiconductor substrate 113. Such individual devices mays be formed on the first semiconductor substrate 113 by using a general plating process, an etching process, and the like.

In an example embodiment, the forming of the first chip pad 115s may include forming the first chip pads 115 on the first active layer AL_1 of the first semiconductor substrate 113. The first chip pads 115 may be formed on the first active layer AL_1 and may be electrically connected to the individual devices in the first active layer AL_1.

In an example embodiment, the forming of the first passivation layer 117 may include spreading the first passivation layer 117 on the first active layer AL_1 of the first semiconductor substrate 113 to at least partially surround side portions of the first chip pad 115. The first passivation layer 117 may at least partially surround the side surfaces of the first chip pad 115, but may expose one surface of the first chip pad 115 to the outside.

Figure 10:
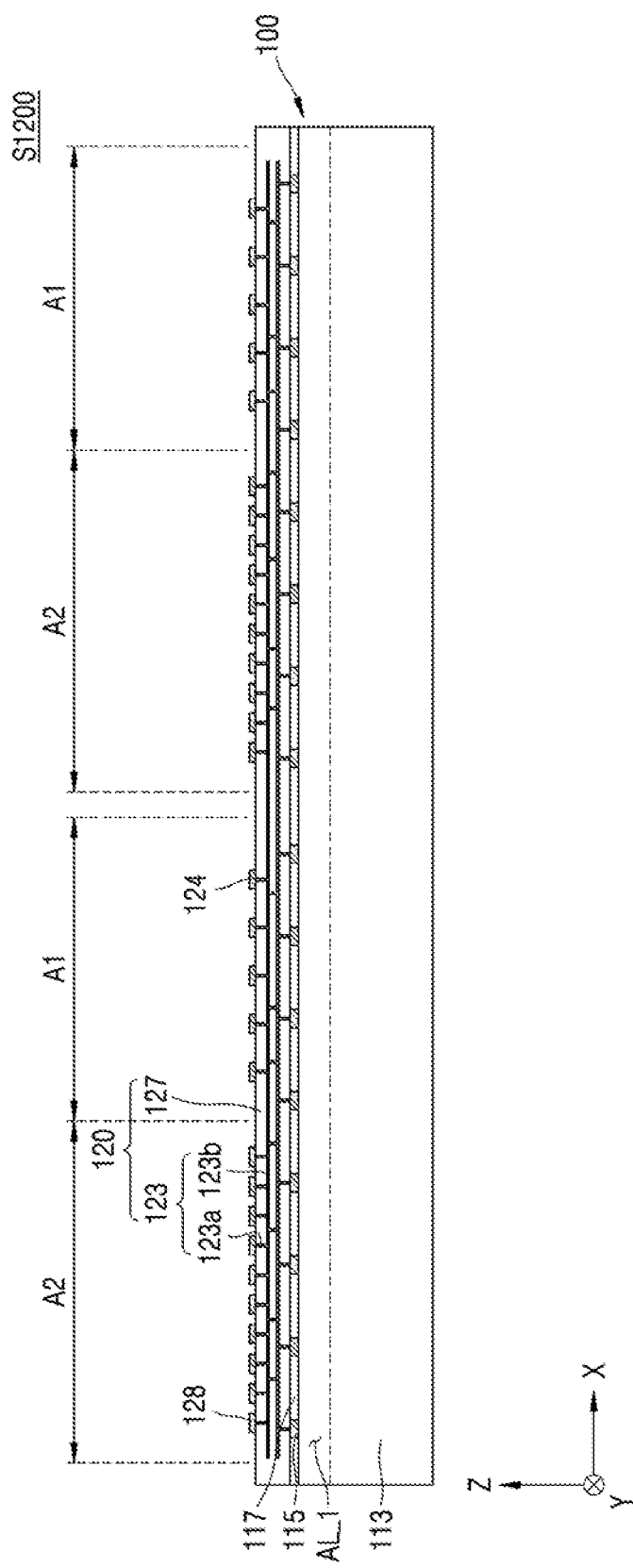

Referring to FIGS. 8 and 10, the manufacturing method S100 of the semiconductor package may include forming the first redistribution structure 120 (S1200).

Operation S1200 may include forming the first redistribution insulating layer 127 and forming the first redistribution pattern 123 that is electrically connected to the first chip pad 115 in the first redistribution insulating layer 127. The first redistribution structure 120 may be formed by using a general photolithography process, a plating process, an etching process, and the like.

In an example embodiment, the forming of the first redistribution layer 127 may include spreading the insulating material including the PID used for the photolithography process on the first surface 110a of the first semiconductor chip 110.

In an example embodiment, the forming of the first redistribution pattern 121 may include forming the first redistribution via pattern 123a, which extends in the first redistribution insulating layer 127 in the vertical direction, and the first redistribution line pattern 123b that extends in the first redistribution insulating layer 127 in the horizontal direction.

In an example embodiment, the first redistribution structure 120 may include the first area A1 and the second area A2 next to the first area A1 and being larger than the first area A1. Also, the first area A1 may be an area of the first redistribution structure 120 where the second semiconductor chip 210 and the passive element 220 are mounted, and the second area A2 may be an area of the first redistribution structure 120 where the conductive posts 130 are mounted.

The first and second areas A1 and A2 of the first redistribution structure 120 are described with reference to FIGS. 1 to 3, and thus, detailed descriptions thereof will be omitted.

After operation S1200, forming the chip connection pad 124 in the first area A1 of the first redistribution structure 120 may be additionally performed. The chip connection pad 124 may contact the first redistribution via pattern 123a of the first redistribution pattern 123 in the first area A1.

Forming the first post connection pads 128 in the second area A2 of the first redistribution structure 120 may be additionally performed. The first post connection pads 128 may contact the first redistribution via pattern 123a of the first redistribution pattern 123 in the second area A2.

Figure 11:
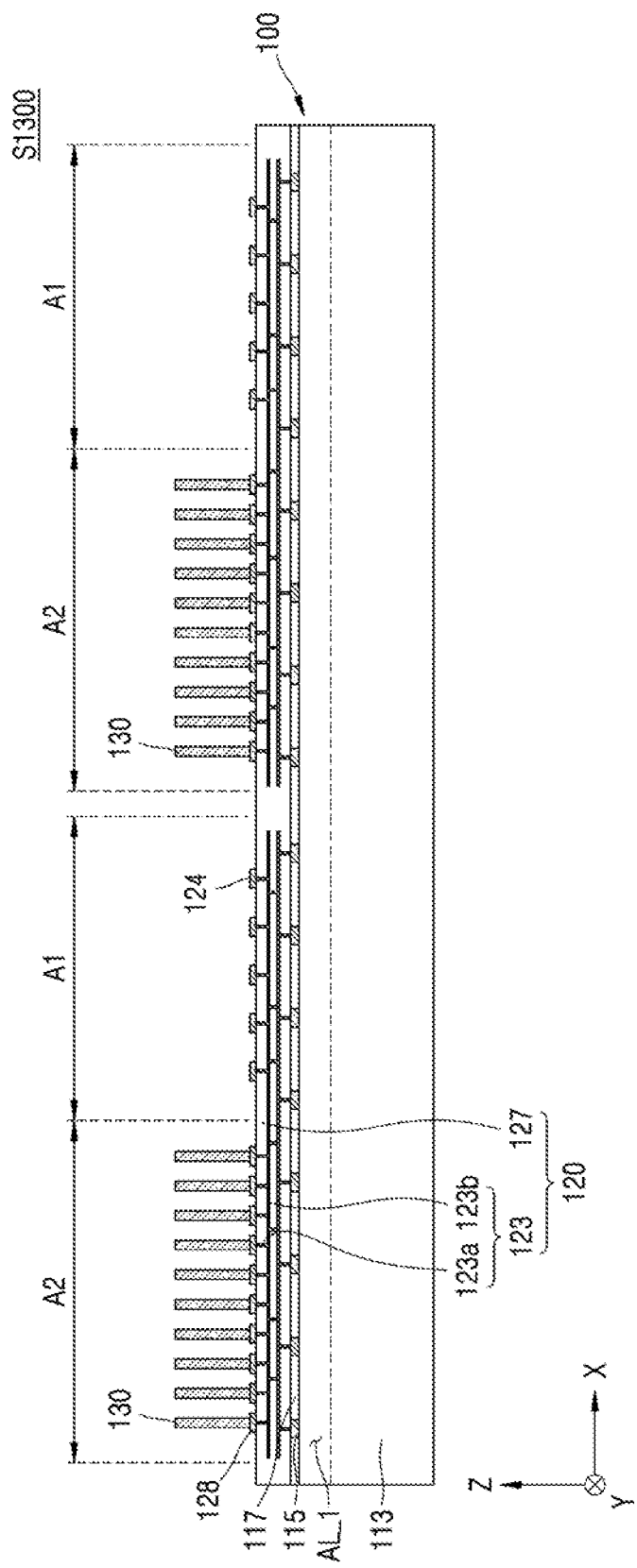

Referring to FIGS. 8 and 11 the manufacturing method S100 of the semiconductor package may include mounting the conductive posts 130 on the first redistribution structure 120 (S1300).

Operation S1300 may include mounting the conductive posts 130 on the first post connection pads 128 in the second area A2 of the first redistribution structure 120. The conductive posts 130 may be arranged in a honeycomb or zigzag shape formed in the second area A2 of the first redistribution structure 120. The arrangement shape of the conductive posts 130 may be readily apparent when viewed on an X-Y plane.

In an example embodiment, the mounting of the conductive posts 130 on the first redistribution structure 120 (S1300) may be performed prior to an operation of mounting the second semiconductor chip 210 on the first redistribution structure 120 (S1400).

The conductive posts 130 are mounted on the first redistribution structure 120 before the second semiconductor chip 210 is mounted, and the conductive posts 130 may be mounted in the second area A2 separated from the first area A1. Thus, a placement of the conductive posts 130 may not interfere with that of the second semiconductor chip 210. Accordingly, the conductive posts 130 may be arranged in the second area A2. Also, because the conductive posts 130 may be rigidly fixed to the first redistribution structure 120, rotation and tilting of the conductive posts 130 may be prevented.

Figure 12:
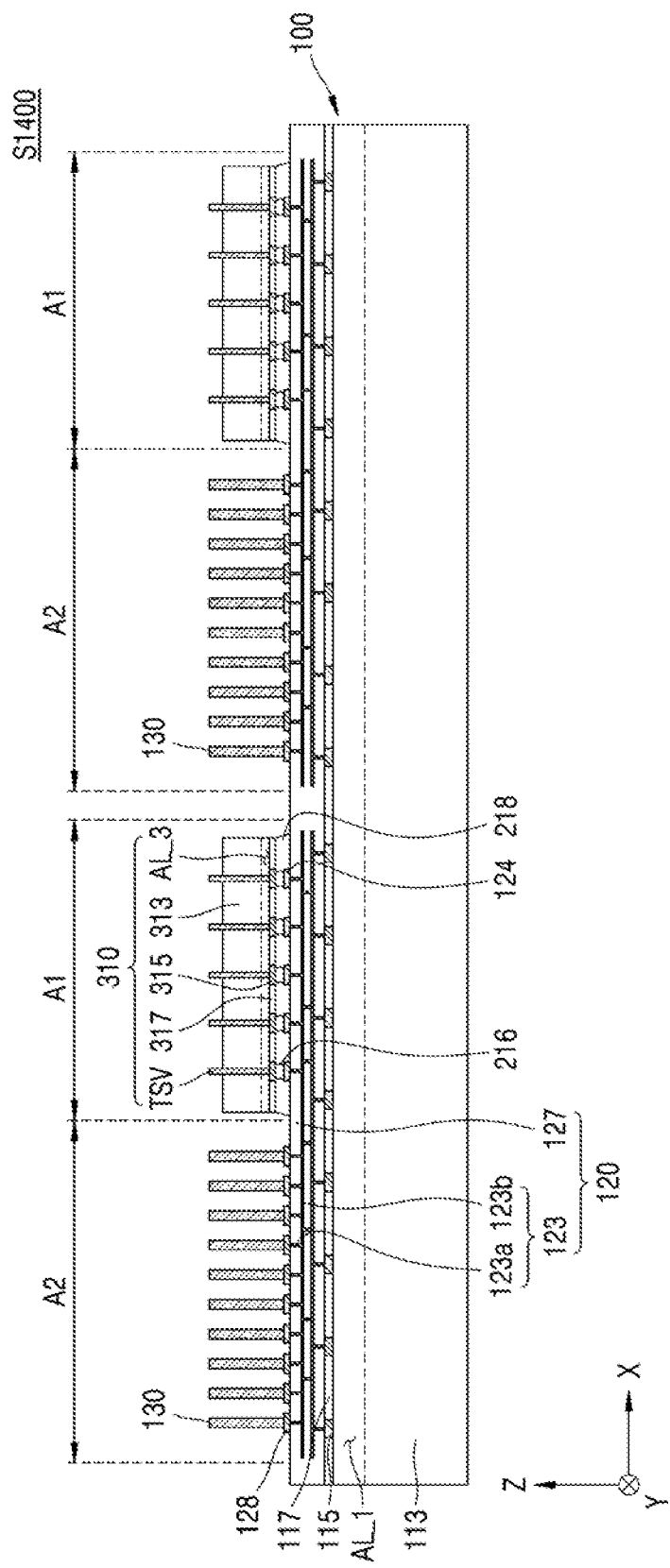

Referring to FIGS. 8 and 12, the manufacturing method S100 of the semiconductor package may include mounting a second semiconductor chip 310 on the first redistribution structure 120 (S1400).

Operation S1400 may include mourning the second semiconductor chip 310 on the first redistribution structure 120 to enable the second active layer AL_3 of the second semiconductor chip 210 to be proximate to the first active layer AL_1 of the first semiconductor chip 110.

In an example embodiment, the second semiconductor chip 310 may be electrically connected to the first redistribution pattern 123 of the first redistribution structure 120 by the chip connection terminal 216 disposed between the second semiconductor chip 310 and the first redistribution structure 120.

In an example embodiment, the second semiconductor chip 310 may be rigidly fixed to one surface of the first redistribution structure 120 by the adhesive layer 218 disposed between the second semiconductor chip 310 and the first redistribution structure 120.

In an example embodiment, the through electrode TSV of the second semiconductor chip 310 may protrude from the fourth surface 210b of the second semiconductor chip 210. Accordingly, in operation S1400, a portion of the through electrode TSV may be exposed to the outside.

In an example embodiment, mounting the passive element (220 of FIG. 2) on the first redistribution structure 120 may be performed. For example, the passive element 220 may be electrically connected to the first redistribution pattern 123 of the first redistribution structure 120 by the passive element connection pad (126 of FIG. 3).

Because the manufacturing method of the semiconductor package 20 may include mounting the second semiconductor chip 210 and the passive element 220 in the first area A1, the electrical connection between the second semiconductor chip 210 and the passive element 220 may be simplified, and the electrical path distance between the second semiconductor chip 210 and the passive element 220 may decrease.

Figure 13:
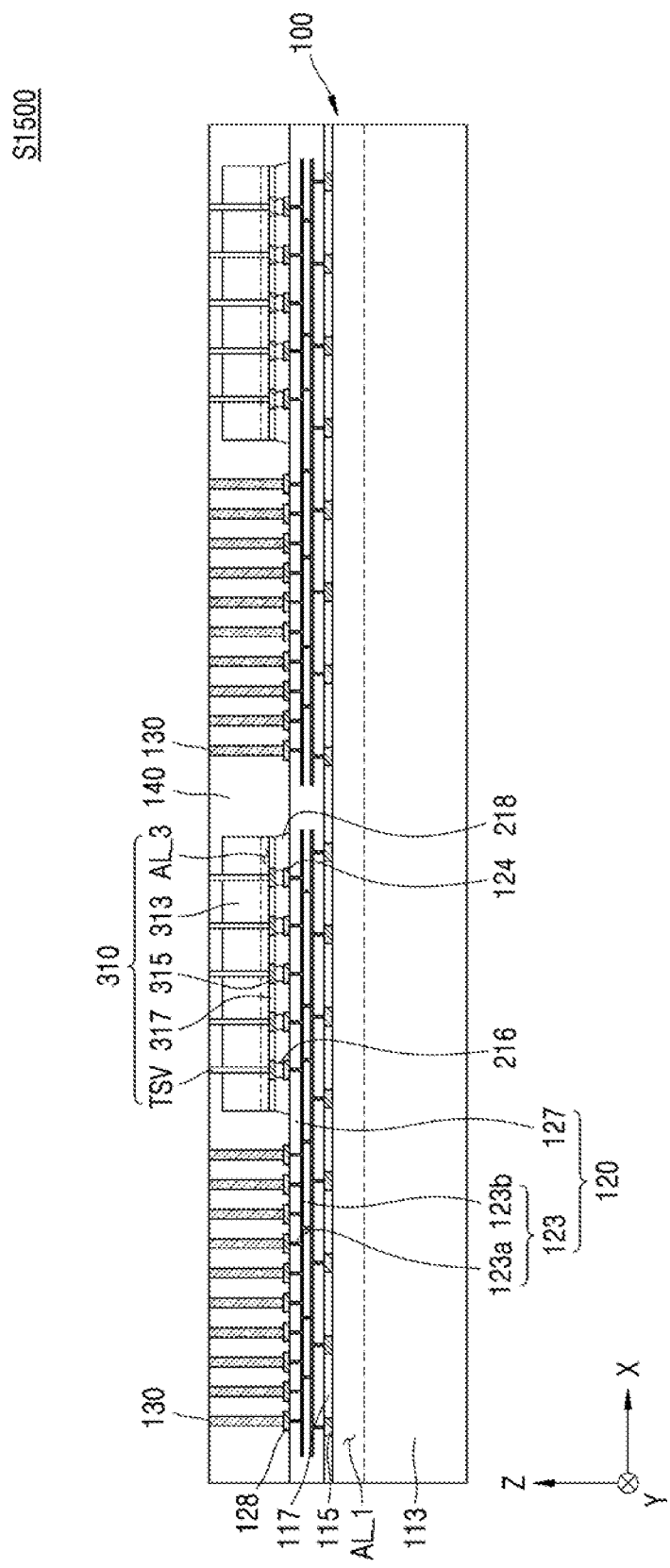

Referring to FIGS. 8 and 13, the manufacturing method S100 of the semiconductor package may include forming the first molding layer 140 on the first redistribution structure 120 (S1500).

Operation S1500 may include forming the first molding layer 140 on the first redistribution structure 120 to at least partially surround the second semiconductor chip 310 the passive element 220, and the conductive posts 130, and grinding a portion of the first molding layer 140.

In an example embodiment, the first molding layer 140 may include an EMC. However, the material of the molding material is not limited to the EMC and may include various materials such as an epoxy-based material, a thermosetting material, a thermoplastic material, and a UV treatment material.

In an example embodiment, in the forming of the first molding layer 140, the first molding layer 140 may cover the second semiconductor chip 310, the passive element 220 and the conductive posts 130.

In an example embodiment, a portion of the first molding layer 140 may be ground to expose the through electrode TSV of the second semiconductor chip 310 and a surface of the conductive post 130 to the outside.

In an example embodiment, the first molding layer 140 may be ground to make one surface of the first molding layer 140 be on the same plane as one surface of the through electrode TSV and one surface of the conductive post 130.

Figure 14:
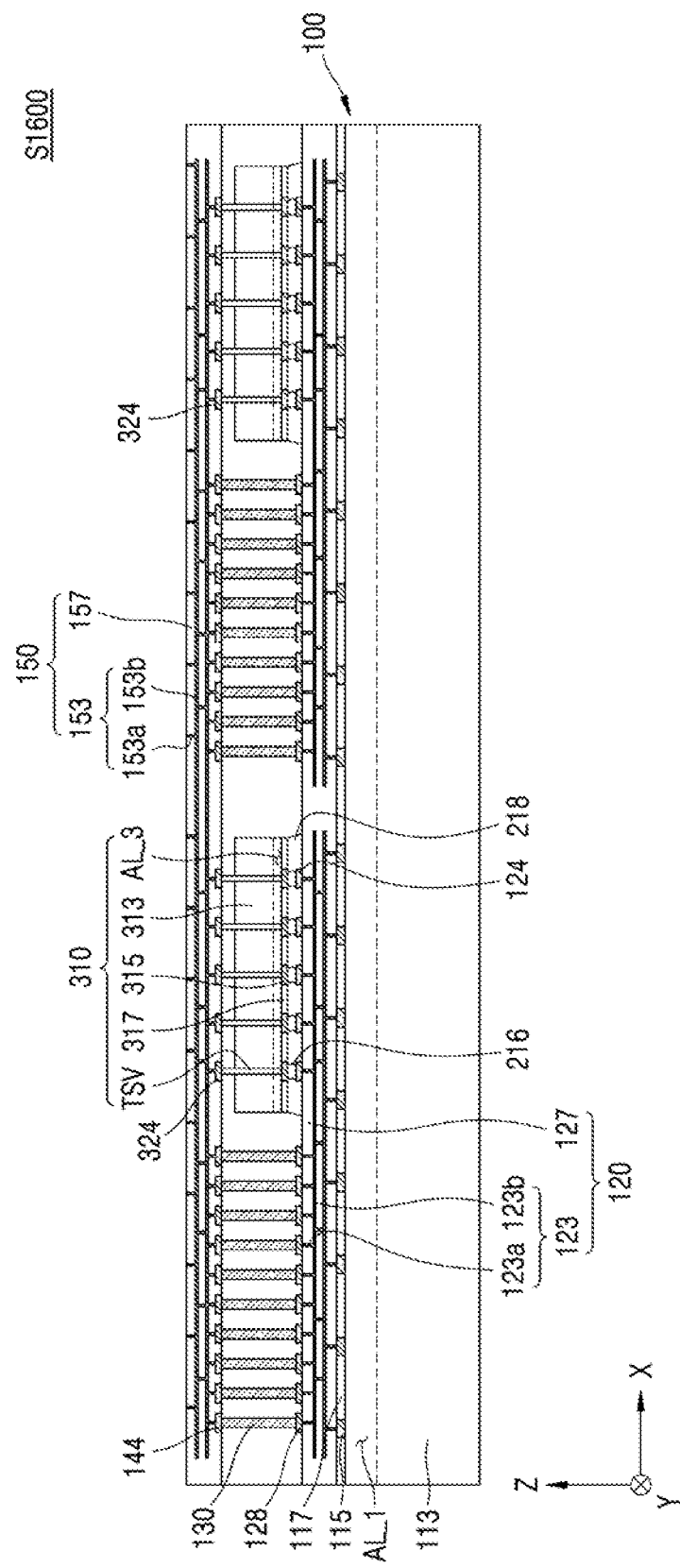

Referring to FIGS. 8 and 14, the manufacturing method S100 of the semiconductor package may include forming the second redistribution structure 150 on the first molding layer 140 (S1600).

Before operation S1600 is performed, the second post connection pads 144 may be formed on the first molding layer 140. The second post connection pad 144 may be formed on one surface of the conductive post 130 which is exposed by the first molding layer 140.

Forming the through electrode connection pad 324 on the first molding layer 140 may also be performed before operation S1600. The through electrode connection pad 324 may be attached to one surface of the through electrode TSV that is exposed by the first molding layer 140.

Operation S1600 may include forming the second redistribution insulating layer 157 and forming the second post connection pad 144 and the second redistribution pattern 153, which is electrically connected to the through electrode connection pad 324, in the second redistribution insulating layer 157. The second redistribution structure 150 may be formed by using a general photolithography process, as plating process, an etching process, and the like.

In an example embodiment, the forming of the second redistribution insulating layer 157 may include spreading an insulating material including a PID used for the photolithography process on the first molding layer 140.

In an example embodiment, the forming of the second redistribution pattern 153 may include forming the second redistribution via pattern 153a, which extends in the second redistribution insulating layer 157 in the vertical direction, and the second redistribution line pattern 153b which extends in the second redistribution insulating layer 157 in the horizontal direction.

Figure 15:
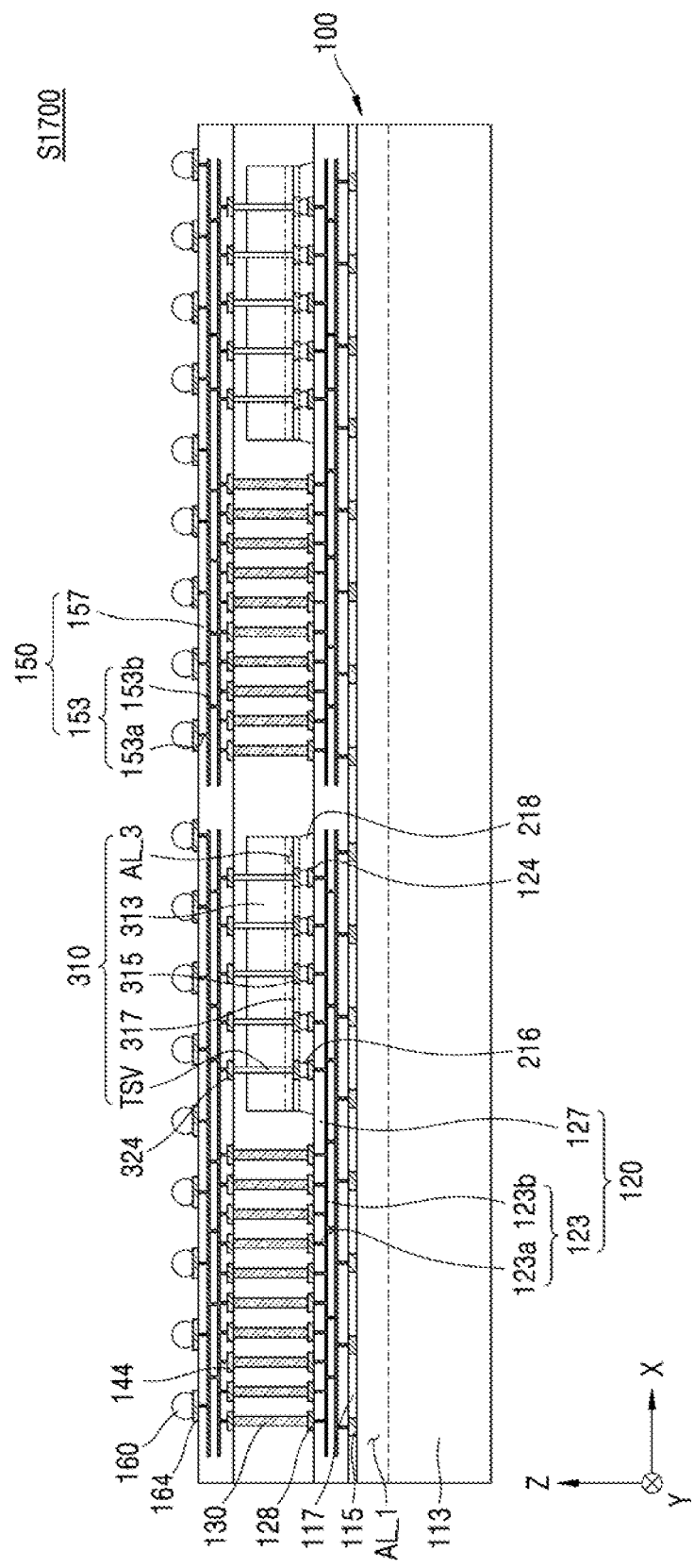

Referring to FIGS. 8 and 15, the manufacturing method S100 of the semiconductor package may include forming the package connection terminal 160 on the second redistribution structure 150 (S1700).

Before operation S1700 is performed, forming the package connection pad 164 mays be performed. The package connection pad 164 may contact the second redistribution via pattern 153b on the second redistribution insulating layer 157.

Operation S1700 may include mounting, on the package connection pad 164, a solder ball that includes a metal material including at least one of Sn, Ag, Cu, and Al, though the present disclosure is not necessarily limited to these materials. For example, the package connection terminal 160 may be melted through a reflow process and coupled to the package connection pad 164.

Figure 16:
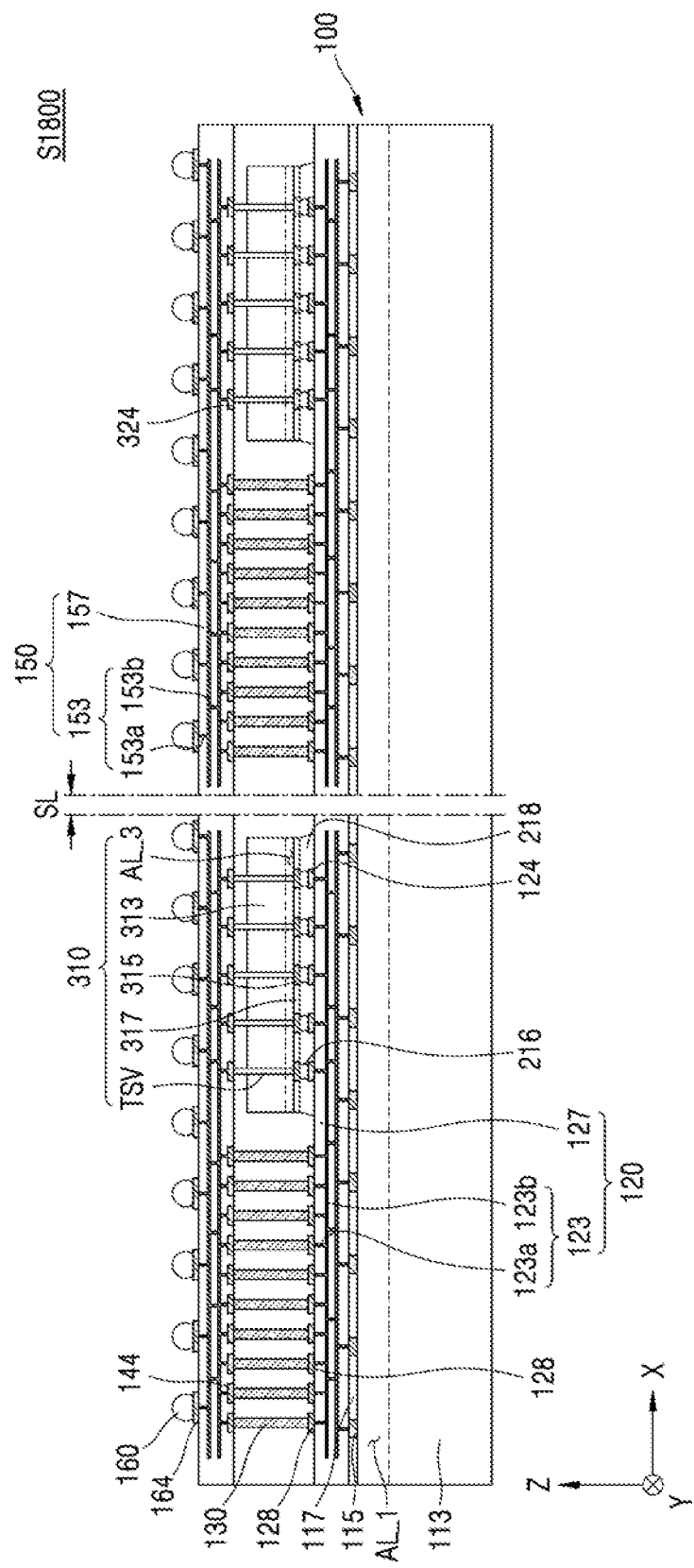

Referring to FIGS. 8 and 16, the manufacturing method S100 of the semiconductor package may include individualizing the semiconductor package (S1800).

Operation S1800 may include cutting scribe lanes SL of the structure of FIG. 16. In an example embodiment, operation S1800 may include cutting the scribe lanes SL by using a blade wheel.

However, the present disclosure is not necessarily limited thereto, and operation S1800 may include cutting the scribe lanes SL by using a laser. For example, operation S1800 may include cutting the scribe lanes SL by irradiating light, which is emitted from the laser, to the inside of the scribe lanes SL.

The semiconductor package 20, which is manufactured according to the manufacturing method S100 of the semiconductor package according to an example embodiment, may include the first redistribution structure 120 that includes the first area A1, where the second semiconductor chip 210 and the passive element 220 are mounted, and the second area A2, which is next to the first area A1 and where the conductive posts 130 are mounted.

Because the first area A1 and the second area A2 of the first redistribution structure 120 may be separated from each other, the arrangement of the second semiconductor chip 210 and the passive element 220 in the first area A1 and the arrangements of the conductive posts 130 in the second area A2 may be simplified. Accordingly, the size of the semiconductor package 20, which is manufactured according to the manufacturing method S100 of the semiconductor package, may be reduced.

Also, because the second semiconductor chip 210 and the passive element 220 may be disposed in the first area A1 the electrical connection between the second semiconductor chip 210 and the passive element 220 may be simplified, and the electrical path distance between the second semiconductor chip 210 and the passive element 220 may decrease.

Also, the conductive posts 130 may be mounted prior to the second semiconductor chip 210 and the passive element 220, and the conductive posts 130 may be disposed in the second area A2 separated from the first area A1. Thus, the arrangements of the conductive posts 130 may not interfere with the arrangement of the second semiconductor chip 210 and the passive element 220. Also, because the conductive posts 130 may be rigidly mounted on the first redistribution structure 120, the rotation and tilting of the conductive posts 130 may be prevented.

While the inventive concept has been particularly shown and described with reference to embodiments thereof, it will be understood that various changes in form and details may be made therein without departing from the spirit and scope of the following claims.

What is claimed is:
1. A semiconductor package comprising;
    a first semiconductor chip comprising a first surface and
        a second surface opposite to the first surface, and comprising a first active layer on a portion adjacent to the first surface, the first active layer including first chip pads;

a first redistribution structure disposed on the first surface of the first semiconductor chip and connected to the first semiconductor chip, wherein the first redistribution structure comprises a first area and a second area located next to the first area;

a second semiconductor chip mounted in the first area of the first redistribution structure, wherein the second semiconductor chip comprises a third surface, and a fourth surface opposite to the third surface, and comprising a second active layer disposed on a portion of the second semiconductor chip adjacent to the third surface, the second active layer including second chip pads;

conductive posts mounted in the second area of the first redistribution structure;

a molding layer at least partially surrounding the second semiconductor chip and the conductive posts on the first redistribution structure; and a second redistribution structure disposed on the molding layer and connected to the conductive posts, wherein the first surface of the first semiconductor chip including the first active layer is disposed proximate to the first redistribution structure, and wherein the third surface of the second semiconductor chip including the second active layer is disposed proximate to the first distribution structure, wherein the first redistribution structure including a plurality of connections electrically connect each of the first chip pads and each of the second chip pads.

2. The semiconductor package of claim 1, further comprising a passive element disposed in the first area of the first redistribution structure.

3. The semiconductor package of claim 1, wherein a planar area occupied by the first area is between about 10% and about 40% of a planar area of the first redistribution structure, and a planar area occupied by the second area is between about 60% and about 90% of a planar area of the first redistribution structure.

4. The semiconductor package of claim 1, further comprising a deformation prevention structure attached to the second surface of the first semiconductor chip and comprising a material with a coefficient of thermal expansion less than a coefficient of thermal expansion of the first semiconductor chip.

5. The semiconductor package of claim 1, wherein the first semiconductor chip is larger than the second semiconductor chip, and a side surface of the first semiconductor chip is on the same plane as a side surface of the first redistribution structure, a side surface of the molding layer, and a side surface of the second redistribution structure.

6. The semiconductor package of claim 1, wherein the molding layer covers the fourth surface of the second semiconductor chip.

7. The semiconductor package of claim 1, wherein one surface of the molding layer is on the same plane as the fourth surface of the second semiconductor chip, and the fourth surface of the second semiconductor chip is supported by the second redistribution structure.

8. The semiconductor package of claim 1, wherein the conductive posts are disposed in a zigzag or honeycomb shape in the second area, and a length of the conductive posts in a vertical direction is greater than a length of the second semiconductor chip in the vertical direction.

9. A semiconductor package comprising:

a first semiconductor chip comprising a first surface and a second surface, which is opposite to the first surface, and comprising a first active layer on a portion adjacent to the first surface;

a first redistribution structure disposed on a first surface of the first semiconductor chip and connected to the first semiconductor chip and comprising a first area and a second area that is next to the first area and is greater than the first area;

a second semiconductor chip mounted on the first area of the first redistribution structure, comprising a third surface, and a fourth surface which is opposite to the third surface, and comprising a second active layer, which is formed on a portion adjacent to the third surface, and a through electrode penetrating at least a portion of the second semiconductor chip and connected to the second active layer;

a passive element mounted in the first area of the first redistribution structure;

conductive posts mounted in the second area of the first redistribution structure;

a molding layer at least partially surrounding the second semiconductor chip, the passive element, and the conductive posts on the first redistribution structure; and a second redistribution structure disposed on the molding layer and connected to the through electrodes and the conductive posts of the second semiconductor chip, wherein a side surface of the molding layer is disposed on the same plane as a side surface of the first semiconductor chip.

10. The semiconductor package of claim 9, wherein a length of the first area in a first direction is between about 10% and about 40% of a length of the first redistribution structure in the first direction, a length of the second area in the first direction is between about 60% and about 90% of the length of the first redistribution structure in the first direction, and the sum of the lengths of the first area and the second area in the first direction is a same as a length of the first redistribution structure in the first direction.

11. The semiconductor package of claim 9, further comprising a deformation prevention structure attached to the second surface of the first semiconductor chip and comprising a material with a coefficient of thermal expansion less than a coefficient of thermal expansion of the first semiconductor chip.

12. The semiconductor package of claim 9, wherein a surface of the molding layer is on the same plane as the fourth surface of the second semiconductor chip, and the fourth surface of the second semiconductor chip is supported by the second redistribution structure.

13. The semiconductor package of claim 9, wherein the first semiconductor chip comprises a logic semiconductor chip, and the second semiconductor chip comprises a memory semiconductor chip.

14. The semiconductor package of claim 13, wherein the first semiconductor chip is longer than the second semiconductor chip, and a side surface of the first semiconductor chip is on the same plane as a side surface of the first redistribution structure, a side surface of the molding layer, and a side surface of the second redistribution structure.

15. A semiconductor package comprising:
a package substrate;
a semiconductor device mounted on the package substrate, wherein the semiconductor device comprises: a first semiconductor chip comprising a first surface and a second surface opposite to the first surface and comprising a first active layer on a portion adjacent to the first surface, the first active layer including first chip pads;
a first redistribution structure disposed on the first surface of the first semiconductor chip and comprising a first area and a second area located next to the first area;
a second semiconductor chip mounted in the first area of the first redistribution structure, comprising a third surface, and a fourth surface opposite to the third surface, and comprising a second active layer on a portion adjacent to the third surface, the second active layer including second chip pads;
conductive posts mounted in the second area of the first redistribution structure;
a molding layer at least partially surrounding the second semiconductor chip and the conductive posts on the first redistribution structure;
a second redistribution structure disposed on the molding layer and connected to the conductive posts; and
a package connection terminal connecting the semiconductor device and the package substrate to each other,
wherein the first surface of the first semiconductor chip including the first active layer is disposed proximate to the first redistribution structure, and wherein the third surface of the second semiconductor chip including the second active layer is disposed proximate to the first distribution structure, wherein the first redistribution structure including a plurality of connections electrically connect each of the first chip pads and each of the second chip pads.

16. The semiconductor package of claim 15, wherein the first area is smaller than the second area.

17. The semiconductor package of claim 16, wherein a length of the first area in a first direction is between about 10% and about 40% of a length of the first redistribution structure in the first direction,
a length of the second area in the first direction is between about 60% and about 90% of the length of the first redistribution structure in the first direction, and
lengths of the first area and the second area in a second direction perpendicular to the first direction are the same as a length of the first redistribution structure in a second direction.

18. The semiconductor package of claim 15, wherein the second semiconductor chip further comprises through electrodes configured to penetrate at least a portion of the second semiconductor chip, wherein one side of the through electrodes are connected to the second active layer, and the other side of the through electrodes are connected to the second redistribution structure,
and wherein a portion of the through electrodes, which protrude from the fourth surface of the second semiconductor chip, are at least partially surrounded by the molding layer.

19. The semiconductor package of claim 15, wherein the semiconductor device further comprises:
a passive element disposed in the first area of the first redistribution structure and at least partially surrounded by the molding layer; and
a deformation prevention structure attached to the second surface of the first semiconductor chip.

20. The semiconductor package of claim 19, wherein a length of the conductive posts in a vertical direction is greater than lengths of the second semiconductor chip and the passive element in the vertical direction.

* * * * *